United States Patent [19]
Yamanaka et al.

[11] Patent Number: 5,939,234
[45] Date of Patent: Aug. 17, 1999

[54] CHEMICALLY AMPLIFIED POSITIVE RESIST COMPOSITION

[75] Inventors: Tsukasa Yamanaka; Toshiaki Aoai; Toru Fujimori, all of Shizuoka, Japan

[73] Assignee: Fuji Photo Film Co., Ltd., Kanagawa, Japan

[21] Appl. No.: 08/655,233

[22] Filed: Jun. 5, 1996

[30] Foreign Application Priority Data

Jun. 5, 1995 [JP] Japan ................................. 7-138295
Mar. 22, 1996 [JP] Japan ................................. 8-066665

[51] Int. Cl.[6] ................................................. G03F 7/004
[52] U.S. Cl. ..................... 430/270.1; 430/170; 430/176; 430/905; 430/910; 430/920
[58] Field of Search ..................... 430/270.1, 170, 430/905, 176, 910, 920

[56] References Cited

U.S. PATENT DOCUMENTS

| | | | |
|---|---|---|---|
| 4,250,247 | 2/1981 | Sander et al. | 430/270.1 |
| 5,217,843 | 6/1993 | Dammel et al. | 430/270.1 |
| 5,352,564 | 10/1994 | Takeda et al. | 430/270.1 |
| 5,356,752 | 10/1994 | Cabrera et al. | 430/270.1 |
| 5,498,506 | 3/1996 | Wengenroth et al. | 430/270.1 |
| 5,595,855 | 1/1997 | Padmanaban et al. | 430/270.1 |
| 5,612,170 | 3/1997 | Takemura et al. | 430/270.1 |
| 5,624,787 | 4/1997 | Watanabe et al. | 430/270.1 |
| 5,629,134 | 5/1997 | Oikawa et al. | 430/270.1 |
| 5,679,496 | 10/1997 | Ohsawa et al. | 430/270.1 |
| 5,693,452 | 12/1997 | Aoai et al. | 430/270.1 |
| 5,738,972 | 4/1998 | Padmanaban et al. | 430/270.1 |

FOREIGN PATENT DOCUMENTS

| | | |
|---|---|---|
| 0523957 | 1/1993 | European Pat. Off. . |
| 0652488 | 5/1995 | European Pat. Off. . |
| 0709736 | 5/1996 | European Pat. Off. . |
| 0710885 | 5/1996 | European Pat. Off. . |
| 9401805 | 1/1994 | WIPO . |

*Primary Examiner*—John S. Chu
*Attorney, Agent, or Firm*—Sughrue, Mion, Zinn Macpeak & Seas, PLLC

[57] ABSTRACT

Disclosed is a chemically amplified positive resist composition which comprises (A) a compound which contains at least one group selected among tert-alkyl ester groups and tert-alkyl carbonate groups and is capable of increasing solubility of the compound in an alkali aqueous solution by the action of an acid, (B) a compound which contains at least one group selected among acetal groups and silyl ether groups and is capable of increasing solubility of the compound in an alkali aqueous solution by the action of an acid, (C) a compound which is capable of generating an acid by irradiation with an active ray or radiation, and (D) an organic basic compound. The resist composition has high resolving power and forms a satisfactory pattern free from undergoing sensitivity decrease, T-top formation, and change in line width which are caused from exposure to post exposure bake.

3 Claims, No Drawings ly amplified
CHEMICALLY AMPLIFIED POSITIVE RESIST COMPOSITION

FIELD OF THE INVENTION

The present invention relates to a chemically-amplified positive resist composition used for manufacturing semiconductor integrated circuit devices, masks for manufacturing integrated circuits, printed circuit boards, liquid crystal panels, and so forth.

BACKGROUND OF THE INVENTION

When conventional resists composed of a novolak resin and a naphthoquinonediazide compound are used for pattern formation by lithography using far ultraviolet rays or excimer laser rays, strong absorption of these rays by the novolak resin and the naphthoquinonediazide compound in the far ultraviolet region prevents the rays from reaching the bottoms of the resist, resulting in low sensitivity and formation of tapered patterns.

One of means for solving these problems is a chemically amplified resist composition described in U.S. Pat. No. 4,491,628, European Patent 249,139, and so forth. The chemically amplified positive resist composition is a pattern forming material, in which irradiation with a radiation such as far ultraviolet rays causes the formation of an acid in exposed areas, a reaction where the acid functions as a catalyst makes the difference of solubility in a developer between irradiated areas and unirradiated areas, thereby leading to the formation of a pattern on a substrate.

Examples of such a material include a combination of a compound generating an acid by the photolysis thereof with an acetal or an O,N-acetal compound described in JP-A-48-89003 (The term "JP-A" as used herein means an "unexamined published Japanese patent application); a combination of the acid-generating compound with an orthoester or an amidoacetal compound described in JP-A-51-120714; a combination of the acid-generating compound with a polymer having an acetal or a ketal group in the main chain thereof described in JP-A-53-133429; a combination of the acid-generating compound with an enol ether compound described in JP-A-55-12995; a combination of the acid-generating compound with an N-acylimino carbonate compound described in JP-A-55-126236; a combination of the acid-generating compound with a polymer having an orthoester group in the main chain thereof described in JP-A-56-17345; a combination of the acid-generating compound with a tert-alkyl ester compound described in JP-A-60-3625; a combination of the acid-generating compound with a silyl ester compound described in JP-A-60-10247; and a combination of the acid-generating compound with a silyl ether compound described in JP-A-60-37549 and JP-A-60-121446. In principle, these compositions exhibit high sensitivity, because of quantum yields exceeding 1.

Similarly, a system which decomposes by heating in the presence of an acid to become soluble in alkali, although the system is stable in time elapsing at room temperature, include a combination of a compound generating an acid by exposure with an ester or a carbonate compound having a tertiary or secondary carbon (for example, tert-butyl and 2-cyclohexenyl) as described in JP-A-59-45439, JP-A-60-3625, JP-A-62-229242, JP-A-63-27829, JP-A-63-36240, JP-63-250642, Polym. Eng. Sce., vol.23, p.1012 (1983), ACS. Sym., vol.242, p.11 (1984), Semiconductor World, November, 1987, p.91, Macromolecules, vol.21, p.1475 (1988), SPIE, vol.920, p.42 (1988), and so forth. This system also exhibits high sensitivity and can be effective for the above-mentioned light sources of shorter wavelengths, because the system has weaker absorption than the naphthoquinonediazide/novolak resin system in the deep ultraviolet region.

The above-mentioned chemically amplified positive resist compositions can be roughly divided into two systems, that is, a three component system comprising an alkali-soluble resin, a compound which generates an acid by irradiation with an active ray or radiation (photo-acid generator), and a dissolution inhibitive compound acting on an alkali-soluble resin containing an acid-decomposable group and a two component system comprising a resin having a group which decomposes by a reaction with an acid to become soluble in alkali and a photo-acid generator.

For example, a photosensitive composition which contains a compound having a C—O—C or C—O—Si bond decomposing by the action of an acid, a photo-acid generator, an alkali-soluble resin, and a certain amount of an amine or amide compound is described in WO94/01805; a radiation-sensitive resin composition which contains an alkali-soluble resin, a radiation-sensitive acid-forming agent, a dissolution inhibitive compound acting on an alkali-soluble resin having an acid-decomposable group, and further, a nitrogen-containing basic compound is described in JP-A-5-232706; and a positive photosensitive composition which contains a tert-alkyl ester group-containing low molecular weight compound having a molecular weight of 3,000 or less and increasing in solubility in an alkali aqueous solution by the action of an acid, a polyhydroxystyrene resin, and a photo-acid generator is described in JP-A-6-242608.

However, these compositions have the disadvantages of sensitivity decrease, T-top formation and narrowed line width which are caused from exposure to post exposure bake.

SUMMARY OF THE INVENTION

The present invention is to provide an excellent chemically amplified positive resist composition which exhibits high resolution and forms a good resist pattern free from sensitivity decrease, T-top formation and narrowed line width which are caused while time elapses from exposure to post exposure bake.

As a result of intensive studies to solve these problems, the present inventors have found that a chemically amplified positive resist composition which contains two or more kinds of compounds having specific acid-decomposable groups and an organic basic compound exhibits high resolution, and in addition, can solve the above-mentioned problems, thus accomplishing the present invention.

The object of the present invention can be achieved by the following composition. That is, a chemically amplified positive resist composition which comprises (A) a compound which contains at least one group selected among tert-alkyl ester groups and tert-alkyl carbonate groups and is capable of increasing solubility of the compound in an alkali aqueous solution by the action of an acid (hereinafter referred to as Compound (A)), (B) a compound which contains at least one group selected among acetal groups and silyl ether groups and is capable of increasing solubility of the compound in an alkali aqueous solution by the action of an acid (hereinafter referred to as Compound (B)), (C) a compound which is capable of generating an acid by irradiation with an active ray or radiation, and (D) an organic basic compound.

DETAILED DESCRIPTION OF THE INVENTION

The present invention provides a chemically amplified positive resist composition which contains two or more kinds of compounds having specific acid-decomposable groups and an organic basic compound.

In the present invention, the tert-alkyl ester groups and tert-alkyl carbonate groups contained in Compound (A) and the acetal groups and silyl ether groups contained in Compound (B) are groups decomposed by the action of an acid (acid-decomposable groups). The compounds which contain the specific groups and increase the solubility in an alkali aqueous solution by the action of an acid (acid-decomposable group-containing compounds) include an alkali-soluble resin containing the acid-decomposable group (s) (polymer type dissolution inhibitive compound) and a non-polymer type dissolution inhibitive compound containing the acid-decomposable group(s).

The non-polymer type dissolution inhibitive compound means a compound which has a molecular weight of 3,000 or less, comprises a structure prepared by introducing acid-decomposable group(s) into a compound having a single structure (not having repeating units), and becomes alkali-soluble by the action of an acid.

The polymer type dissolution inhibitive compound means a compound which has a structure obtained by introducing acid-decomposable group(s) into a compound having molecular weight distribution prepared by polymerizing a monomer, and becomes alkali-soluble by the action of an acid.

In the present invention, an alkali-soluble resin containing no acid-decomposable group can be used together with the above-mentioned acid-decomposable group-containing compound. When the alkali-soluble resin containing no acid-decomposable group is used, a polymer type dissolution inhibitive compound and a non-polymer type dissolution inhibitive compound are preferably used simultaneously as the acid-decomposable group-containing compounds.

In the present invention, the acid-decomposable group-containing compound having at least one group selected among tert-alkyl ester groups and tert-alkyl carbonate groups as the acid-decomposable group (Compound (A)) is used together with the acid-decomposable group-containing compound having at least one group selected among acetal groups and silyl ether groups as the acid-decomposable group (Compound (B)).

The acid-decomposable group-containing compound include an alkali-soluble resin containing acid-decomposable group(s) (polymer type dissolution inhibitive compound) and a non-polymer type dissolution inhibitive compound containing acid-decomposable group(s).

In the present invention, the polymer type dissolution inhibitive compound and the non-polymer type dissolution inhibitive compound of Compound (A) are used in arbitrary combination with the polymer type dissolution inhibitive compound and the non-polymer type dissolution inhibitive compound of Compound (B). That is, the following combinations are possible.

(1) the polymer type of Compound (A) and the polymer type of Compound (B), which are used preferably at a weight ratio of 80:20 to 20:80, (2) the non-polymer type of Compound (A) and the polymer type of Compound (B), (3) the polymer type of Compound (A) and the non-polymer type of Compound (B), and (4) the non-polymer type of Compound (A) and the non-polymer type of Compound (B), which are used preferably at a weight ratio of 80:20 to 20:80.

Among these, combinations (2) of the non-polymer type of Compound (A) with the polymer type of Compound (B) are particularly preferred.

The chemically amplified positive resist composition of the present invention comprises the above-mentioned acid-decomposable group-containing compounds (A) and (B), a photo-acid generator and an organic basic compound. Preferred chemically amplified positive resist compositions are those described below in a), and more preferred chemically amplified positive resist compositions are those described below in b) and c).

a) Chemically amplified positive resist compositions which contain the polymer type dissolution inhibitive compound of Compound (B) and the non-polymer type dissolution inhibitive compound of Compound (A) and meet the above-mentioned constitution requirements, in which the content rate of the acid-decomposable groups in the polymer type dissolution inhibitive compound of Compound (B) is 0.2 or more, and preferably 0.25 or more, with the upper limit being 0.4, preferably 0.35.

In the present invention, the content rate of the acid-decomposable groups in the alkali-soluble resin containing acid-decomposable groups (polymer type dissolution inhibitive compound) is represented by B/(B+S), wherein B represents the number of the acid-decomposable groups in the resin and S represents the number of alkali-soluble groups which are not protected by the acid-decomposable groups.

b) Chemically amplified positive resist compositions which contain an alkali-soluble resin and the non-polymer type dissolution inhibitive compound and meet the above-mentioned constitution requirements.

c) Chemically amplified positive resist compositions which meet the above-mentioned constitution requirements, in which i: Compound (B) is a polymer type dissolution inhibitive compound having a p-hydroxystyrene structure of which part or all of phenolic hydroxyl groups are protected by at least one group selected among acetal groups and silyl ether groups, and ii: Compound (A) is a non-polymer type dissolution inhibitive compound having a molecular weight of 3,000 or less and containing three or more acid-decomposable groups in one molecule to become soluble in alkali by the decomposition of the groups.

Particularly preferred chemically-amplified positive resist compositions are ones described below in d).

d) chemically amplified positive resist compositions which meet the above-mentioned constituent requirements, in which i: Compound (B) is a polymer type dissolution inhibitive compound, in which the content rate of the acid-decomposable groups is from 0.1 to 0.4, ii: Compound (A) is a non-polymer type dissolution inhibitive compound (A) of which the content is from 5 to 20% by weight based on the whole solid components of the positive type resist composition, and iii: Compound (C) is either an o-nitrobenzyl type photo-acid generator or a photo-acid generator which generates a sulfonic acid.

Compounds used in the present invention are illustrated below in detail.

The non-polymer type dissolution inhibitive compounds of Compounds (A) and (B) include those containing at least one group selected among tert-alkyl ester groups and tert-alkyl carbonate groups as the acid-decomposable groups and those containing at least one group selected among acetal groups and silyl ether groups, respectively. It is preferred to use compounds which each has at least two acid-decomposable groups in one molecule and contains at least 10 bonding atoms, more preferably at least 11 bonding atoms, and most preferably at least 12 bonding atoms between the two acid-decomposable groups (excluding the atoms constituting the acid-decomposable groups) which are the most distant from each other among the acid-decomposable groups, or to use the compounds which each has at least three acid-decomposable groups in one molecule and contains at least 9 bonding atoms, more preferably at least 10 bonding atoms, and most preferably at least 11 bonding atoms between the two acid-decomposable groups which are the most distant from each other among the acid-decomposable groups.

The non-polymer type dissolution inhibitive compound inhibits dissolution of the alkali-soluble resin in alkali, but when subjected to exposure, promotes the dissolution of the resin in alkali, since the acid-decomposable group(s) of the compound is deblocked by the action of an acid generated by the exposure. Dissolution inhibitive compounds having naphthalene, biphenyl, or diphenylcycloalkane as a skelton structure are disclosed in JP-A-63-27829 and JP-A-3-198059, however, these compounds are low in ability of inhibiting the dissolution of alkali-soluble resins, failing to exhibit sufficient profile and resolution.

The non-polymer type dissolution inhibitive compound is preferably a compound which has a single structure having a molecular weight of 3,000 or less and contain three or more alkali-soluble groups in one molecule, and of which 80% or more of the alkali-soluble groups are protected with the specific acid-decomposable groups described above with respect to Compounds (A) or (B). Examples of the acid-decomposable group include a phenolic hydroxyl group and an amide group.

In the present invention, the upper limit of the above-mentioned bonding atoms is preferably 50, and more preferably 30.

When the non-polymer type dissolution inhibitive compound of the present invention contains three or more acid-decomposable groups, and preferably four or more acid-decomposable groups, or even only two acid-decomposable groups, a certain or more distance between the acid-decomposable groups brings a marked improvement in ability of inhibiting the solubility of the alkali-soluble resin.

In the present invention, the distance between the acid-decomposable groups is represented by the number of bonding atoms existing between them (excluding the atoms constituting the acid-decomposable groups). For example, the following compounds (1) and (2) each contain 4 bonding atoms, the distance between the acid-decomposable groups; and compound (3)has bonding atoms.

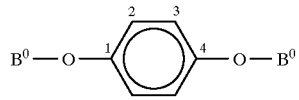

(1)

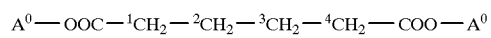

(2)

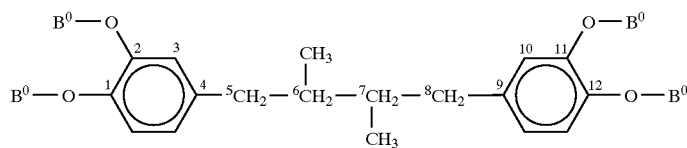

(3)

acid-decomposable group: —COO—A⁰, —O—B⁰

Although the non-polymer type dissolution inhibitive compound of the present invention may contain a plurality of acid-decomposable groups on a benzene ring in both (A) and (B), it is preferred that the compound has a basic structure containing one acid-decomposable group on one benzene ring. Further, the molecular weight of the non-polymer type dissolution inhibitive compound of the present invention is generally 3,500 or less, preferably from 500 to 3,000, and more preferably from 1,000 to 2,500. The non-polymer type dissolution inhibitive compound having a molecular weight falling within the above-mentioned range is preferred in terms of high resolution.

In a preferred embodiment of the present invention, the acid-decomposable groups in (A) are represented by —COO—C($R^{01}$)($R^{02}$)($R^{03}$) or —O—CO—O—C($R^{01}$)($R^{02}$)($R^{03}$), and the acid-decomposable groups are more preferably linked to a parent compound by a structure represented by —$R^0$—COO—C($R^{01}$)($R^{02}$)($R^{03}$) or —Ar—O—CO—O—C($R^{01}$)($R^{02}$)($R^{03}$).

The acid-decomposable groups in (B) are represented by —O—C($R^{04}$)($R^{05}$)—O—$R^{06}$ or —O—Si($R^{07}$)($R^{08}$)($R^{09}$), and the acid-decomposable groups are more preferably linked to a parent compound by a structure represented by —Ar—O—C($R^{04}$)($R^{05}$)—O—$R^{06}$ or —Ar—O—Si($R^{07}$)($R^{08}$)($R^{09}$).

$R^{01}$, $R^{02}$ and $R^{03}$, which may be the same or different, each represents an alkyl group, a cycloalkyl group, an alkenyl group, or an aryl group.

$R^{04}$, $R^{05}$, $R^{07}$, $R^{08}$, and $R^{09}$, which may be the same or different, each represents a hydrogen atom, an alkyl group, a cycloalkyl group, an alkenyl group, or an aryl group, with the proviso that at least 2 groups of $R^{07}$ to $R^{09}$ are groups other than a hydrogen atom and the respective 2 groups of $R^{01}$ to $R^{03}$, $R^{04}$ and $R^{05}$, and $R^{07}$ to $R^{09}$ may combine with each other to form a ring. $R^{06}$ represents an alkyl group or an aryl group. $R^0$ represents a divalent or more aliphatic or aromatic hydrocarbon residue which may contain a substituent, and —Ar— represents a monocyclic or polycyclic, divalent or more aromatic group which may contain a substituent.

Herein, the alkyl group is preferably an alkyl group having 1 to 4 carbon atoms (for example, methyl, ethyl, propyl, n-butyl, sec-butyl, and tert-butyl); the cycloalkyl group is preferably a cycloalkyl group having 3 to 10 carbon atoms (for example, cyclopropyl, cyclobutyl, cyclohexyl, and adamantyl); the alkenyl group is preferably an alkenyl group having 2 to 4 carbon atoms (for example, vinyl, propenyl, allyl, and butenyl); and the aryl group is preferably an aryl group having 6 to 14 carbon atoms (for example, phenyl, xylyl, toluyl, cumenyl, naphthyl, and anthracenyl).

Examples of the substituent include a hydroxyl group, a halogen atom (fluorine, chlorine, bromine, and iodine), a nitro group, a cyano group, the above-mentioned alkyl groups, an alkoxy group (for example, methoxy, ethoxy, hydroxyethoxy, propoxy, hydroxypropoxy, n-butoxy, isobutoxy, sec-butoxy, and tert-butoxy), an alkoxycarbonyl group (for example, methoxycarbonyl and ethoxycarbonyl), an aralkyl group (for example, benzyl, phenethyl and cumyl), an aralkyloxy group, an acyl group (for example, formyl, acetyl, butyryl, benzoyl, cinnamyl, and valeryl), an acyloxy group (for example, butyryloxy), the above-mentioned alkenyl groups, an alkenyloxy group (for example, vinyloxy, propenyloxy, allyloxy, and butenyloxy), the above-mentioned aryl groups, an aryloxy group (for example, phenoxy), and an aryloxycarbonyl group (for example, benzoyloxy).

Examples of the tert-alkyl group of the tert-alkyl ester groups and the tert-alkyl carbonate groups include a tert-butyl group, a tert-pentyl group, and tert-hexyl group, with the tert-butyl group being particularly preferred.

Examples of the acetal group are as follows:

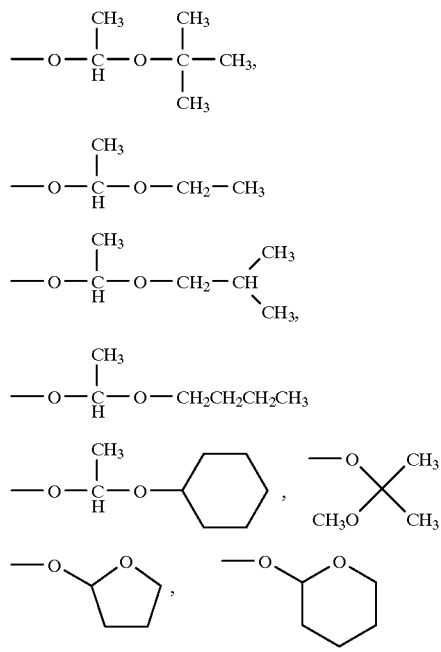

The following acetal group is particularly preferred.

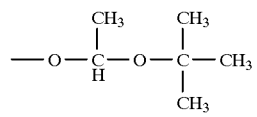

An example of the silyl ether group is as follows:

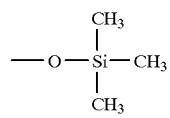

Preferred non-polymer type dissolution inhibitive compounds include polyhydroxy compounds of which part or all of phenolic hydroxyl groups are protected with the above-mentioned groups, —R⁰—COO—A⁰ or —B⁰, these polyhydroxy compounds being described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, Japanese Patent Application Nos. 3-33229, 3-230790, 3-320438, 4-25157, 4-52732, 4-103215, 4-104542, 4-107885, 4-107889, 4-152195, and so forth.

Examples of the non-polymer type dissolution inhibitive compounds for which the polyhydroxy compounds are more preferably used are described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Application Nos. 4-25157, 4-103215, 4-104542, 4-107885, 4-107889, and 4-152195.

Examples thereof include compounds represented by general formulas [I] to [XVI].

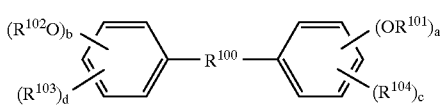

[I]

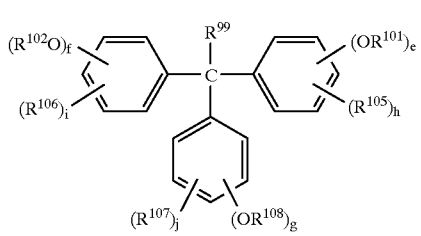

[II]

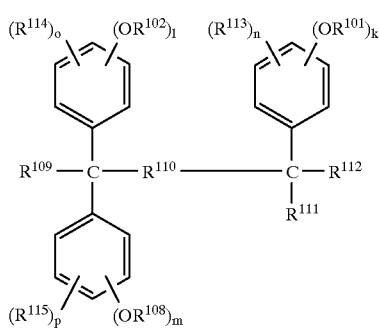
[III]
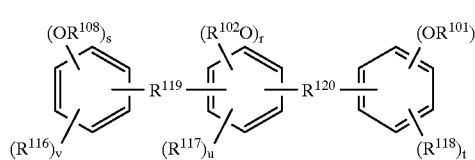
[IV]
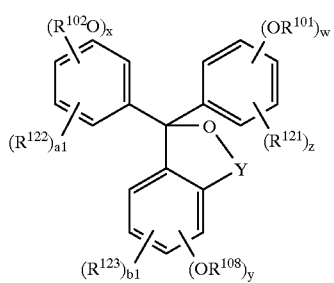
[V]
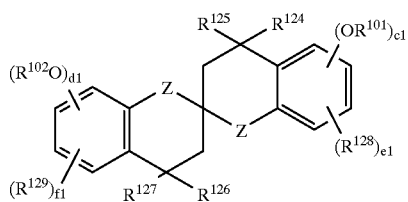
[VI]
[VII]
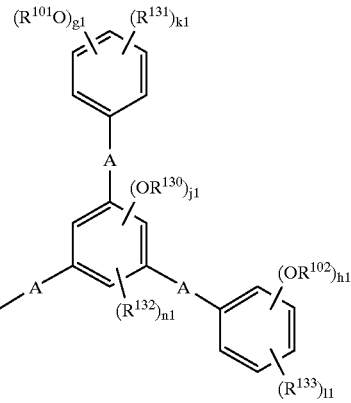
[VIII]
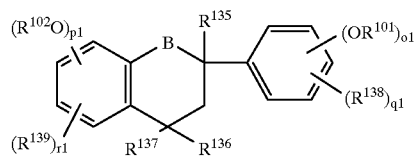
[IX]
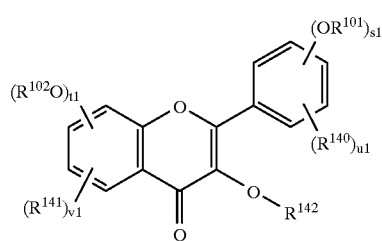
[X]
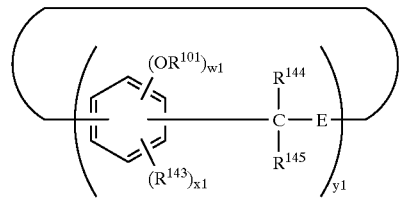
[XI]
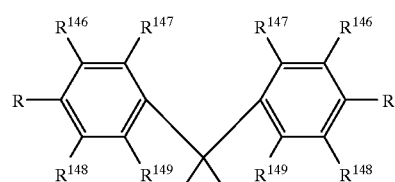
[XII]
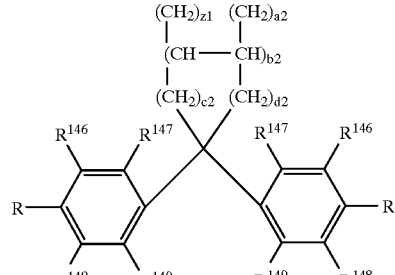

wherein $R^{101}$, $R^{102}$, $R^{108}$ and $R^{130}$ may be the same or different and are a hydrogen atom, $-R^0-COO-C(R^{01})(R^{02})(R^{03})$ or $-CO-O-C(R^{01})(R^{02})(R^{03})$, and $R^0$, $R^{01}$, $R^{02}$, and $R^{03}$ are the same as defined above;

$R^{100}$ is $-CO-$, $-COO-$, $-NHCONH-$, $-NHCOO-$, $-O-$, $-S-$, $-SO-$, $-SO_2-$, $-SO_3-$ or

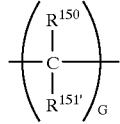

where G=2 to 6, provided that when G=2, at least one of $R^{150}$ and $R^{151}$ is an alkyl group;

$R^{150}$ and $R^{151}$ may be the same or different and are a hydrogen atom, an alkyl group, an alkoxy group, $-OH$, $-COOH$, $-CN$, a halogen atom, $-R^{152}-COOR^{153}$ or $-R^{154}-OH$, $R^{152}$ and $R^{154}$ are independently an alkylene group;

$R^{153}$ is a hydrogen atom, an alkyl group, an aryl group or an aralkyl group;

$R^{99}$, $R^{103}$ to $R^{107}$, $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$, and $R^{143}$ may be the same or different and are a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or $-N(R^{155})(R^{156})$; where $R^{155}$ and $R^{156}$ are independently a hydrogen atom, an alkyl group or an aryl group; $R^{110}$ is a single bond, an alkylene group or

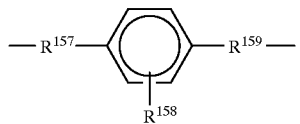

$R^{157}$ and $R^{159}$ may be the same or different and are a single bond, an alkylene group, $-O-$, $-S-$, $-CO-$, or a carboxyl group;

$R^{158}$ is a hydrogen atom, an alkyl group, an alkoxy group, an acyl group, an acyloxy group, an aryl group, a nitro group, a hydroxy group, a cyano group, or a carboxyl group, where the hydroxy group may be substituted with an acid-decomposable group such as t-butoxycarbonylmethyl, tetrahydropyranyl, 1-ethoxy-1-ethyl, and 1-t-butoxy-1-ethyl;

$R^{119}$ and $R^{120}$ may be the same or different and are a methylene group, a lower alkyl-substituted methylene group, a halomethylene group, or a haloalkyl group (the lower alkyl group as used in the present invention means an alkyl group having 1 to 4 carbon atoms);

$R^{124}$ to $R^{127}$ may be the same or different and are a hydrogen atom or an alkyl group; $R^{135}$ to $R^{137}$ may be the same or different and are a hydrogen atom, an alkyl group, an alkoxy group, an acyl group, or an acyloxy group;

$R^{142}$ is a hydrogen atom, $-R^0-COO-C(R^{01})(R^{02})(R^{03})$, $-CO-O-C(R^{01})(R^{02})(R^{03})$ or

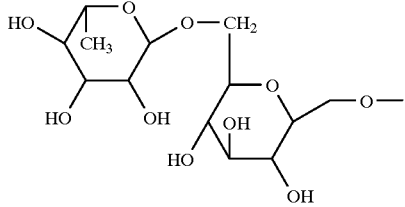

$R^{144}$ and $R^{145}$ may be the same or different and are a hydrogen atom, a lower alkyl group, a lower haloalkyl group or an aryl group;

$R^{146}$ to $R^{149}$ may be the same or different and are a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, provided that the four substituents represented by the same symbol may be the same or different;

Y is $-CO-$ or $-SO_2-$;

Z and B are independently a single bond or $-O-$;

A is a methylene group, a lower alkyl-substituted methylene group, a halomethylene group or a haloalkyl group;

E is a single bond or an oxymethylene group;

when a to z, a1 to y1 are two or more, the group in the parentheses may be the same or different;

a to q, s, t, v, g1 to i1, k1 to m1, o1, q1, s1, and u1 are independently 0 or an integer of 1 to 5;

r, u, w, x, y, z, a1 to f1, p1, r1, t1, v1 to x1 are independently 0 or an integer of 1 to 4;

j1, n1, z1, a2, b2, c2, and d2 are independently 0 or an integer of 1 to 3, provided that at least one of z1, a2, c2, and d2 is 1 or more;

y1 is an integer of 3 to 8;

(a+b), (e+f+g), (k+l+m), (q+r+s), (w+x+y), (c1+d1), (g1+h1+i1+j1), (o1+p1), and (s1+t1)≧2;

(j1+n1)≦3;

(r+u), (w+z), (x+a1), (y+b1), (c1+e1), (d1+f1), (p1+r1), (t1+v1), and (x1+w1)≦4, provided that in the case of formula [V], (w+z) and (x+a1) ≦5; and (a+c), (b+d), (e+h), (f+i), (g+j), (k+n), (l+o), (m+p), (q+t), (s+v), (g1+k1), (h1+l1), (i1+m1), (o1+q1), and (s1+u1)≦5.

(VIII)

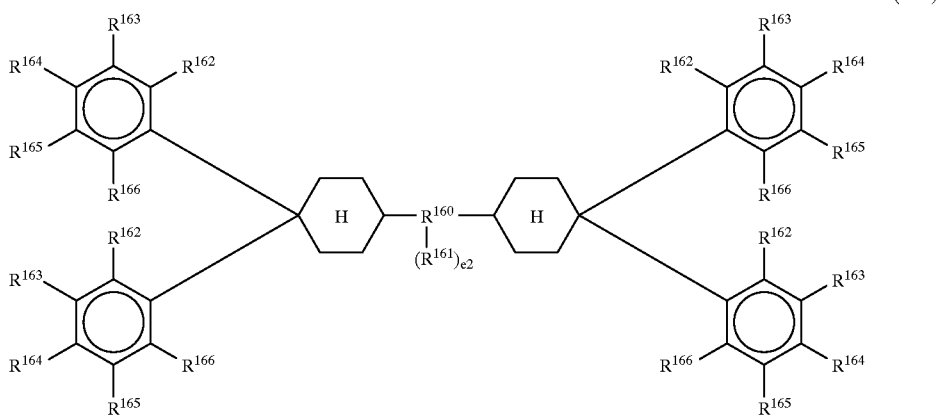

wherein $R^{160}$ is an organic group, a single bond, —S—, —SO—, or

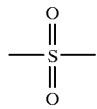

$R^{161}$ is a hydrogen atom, a monovalent organic group or

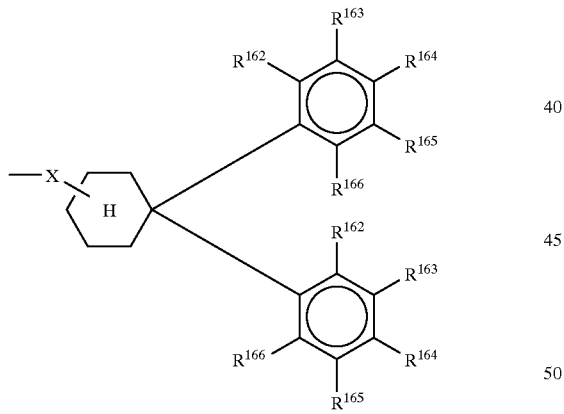

where $R^{162}$ to $R^{166}$ may be the same or different and are a hydrogen atom, a hydroxy group, a halogen atom, an alkyl group, an alkoxy group, an alkenyl group or the group, —O—$R^O$—COO—C($R^{01}$)($R^{02}$)($R^{03}$) or —O—CO—O—C($R^{01}$)($R^{02}$)($R^{03}$); provided that at least two of $R^{162}$ to $R^{166}$ are the group, —O—$R^0$—COO—C($R^{01}$)($R^{02}$)($R^{03}$) or —O—CO—O—C($R^{01}$)($R^{02}$)($R^{03}$) and each 4 or 6 substituents represented by the same symbol may be the same or different; and X is a divalent organic group; and e2 is 0 or 1.

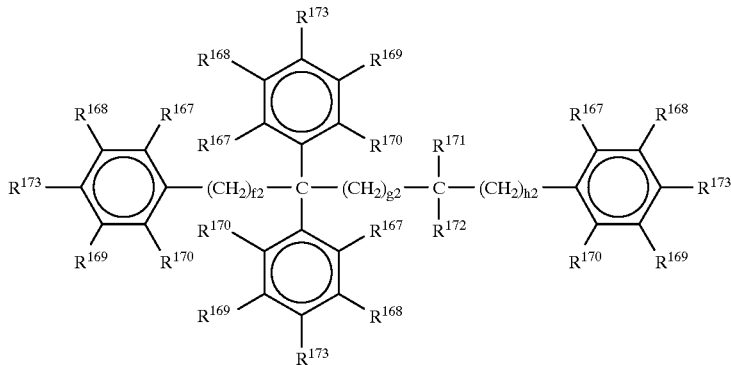
(XIV)

wherein $R^{167}$ to $R^{170}$ may be the same or different and are a hydrogen atom, a hydroxy group, a halogen atom, an alkyl group, an alkoxy group, or an alkenyl group; provided that each 4 to 6 substituents represented by the same symbol may be the same or different;

$R^{171}$ and $R^{172}$ are a hydrogen atom, an alkyl group or

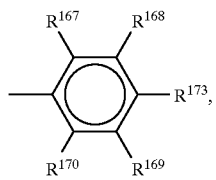

at least two of $R^{173}$ are the group, —O—$R^0$—COO—C($R^{01}$)($R^{02}$)($R^{03}$) or —O—CO—O—C($R^{01}$)($R^{02}$)($R^{03}$) and the other substituents are a hydroxy group; and f2 and h2 each are 0 or 1, and g2 is 0 or an integer of 1 to 4.

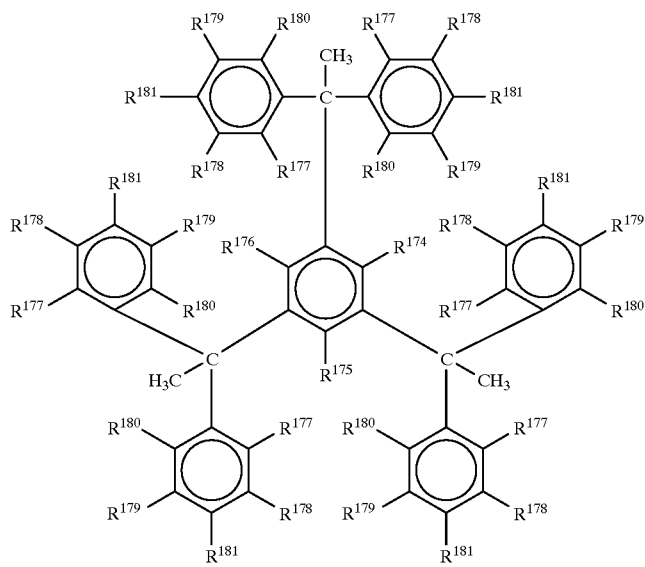
(XV)

wherein $R^{174}$ to $R^{180}$ may be the same or different, and are a hydrogen atom, a hydroxy group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or an aralkoxy group; provided that 6 substituents represented by each of $R^{174}$ to $R^{180}$ may be the same or different; and at least two of $R^{181}$ are —O—$R^0$—COO—C($R^{01}$)($R^{02}$)($R^{03}$) or —O—CO—O—C($R^{01}$)($R^{02}$)($R^{03}$) and the other substituents are a hydroxy group.

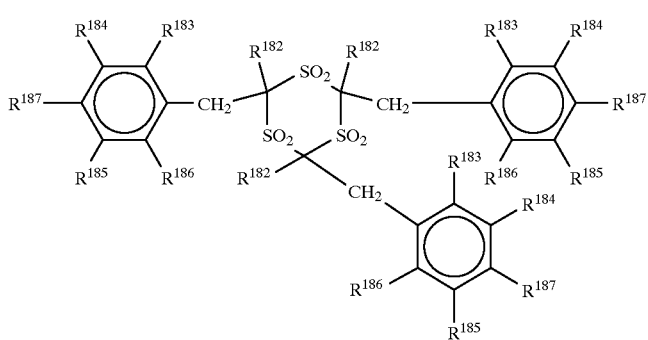

(XVI)

wherein $R^{182}$ is a hydrogen atom or an alkyl group; provided that all the substituents may be the same or different; $R^{183}$ to $R^{186}$ are a hydroxy group, hydrogen atom, a halogen atom, an alkyl group or an alkoxy group; provided that each three substituents represented by the same symbol may be the same or different; and at least two of $R^{187}$ are the group, $-O-R^{0}-COO-C(R^{01})(R^{02})(R^{03})$ or $-O-CO-O-C(R^{01})(R^{02})(R^{03})$ and the other substituents are a hydroxy group.

Examples of the skeletons of the preferred compounds will be described.

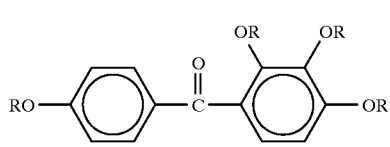

(1)

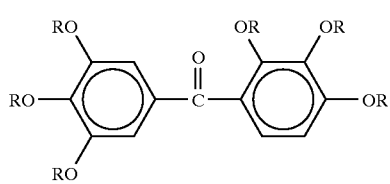

(2)

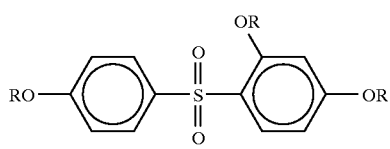

(3)

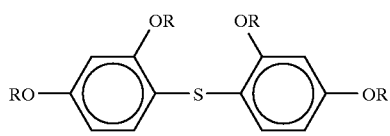

(4)

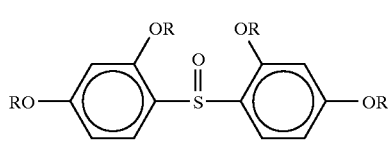

(5)

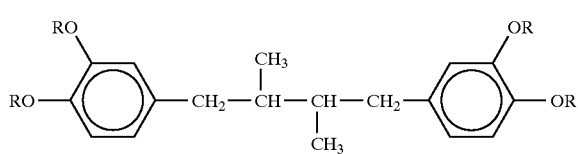

(6)

-continued
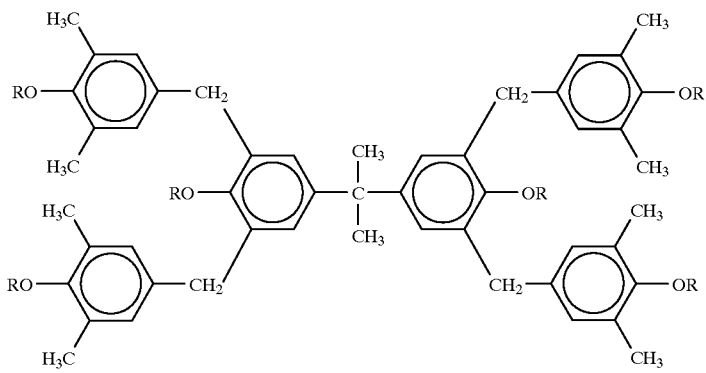
(7)
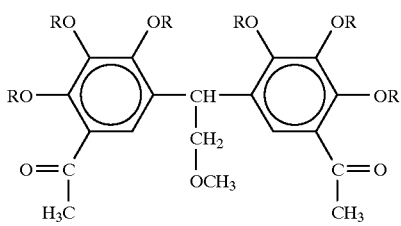
(8)
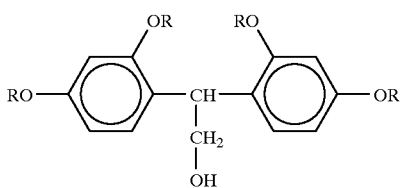
(9)
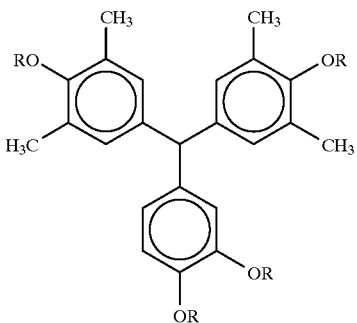
(10)
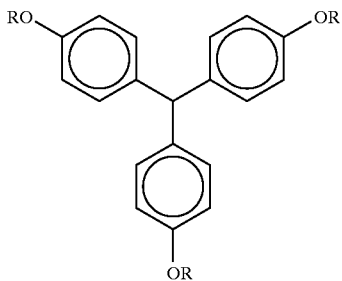
(11)

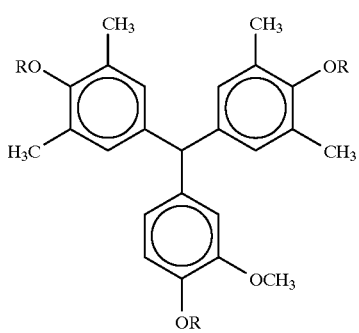
(12)
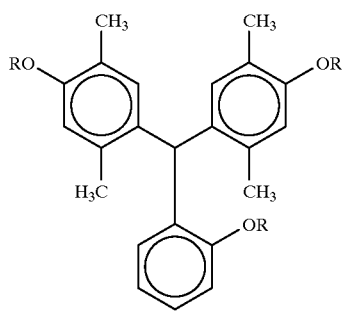
(13)
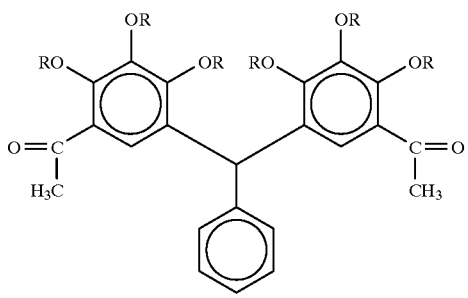
(14)
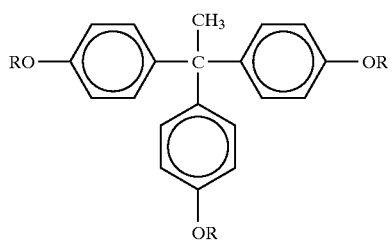
(15)
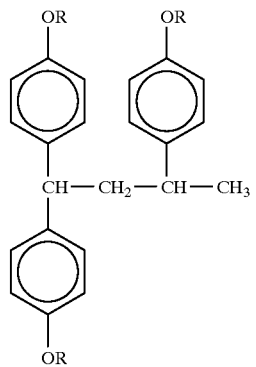
(16)

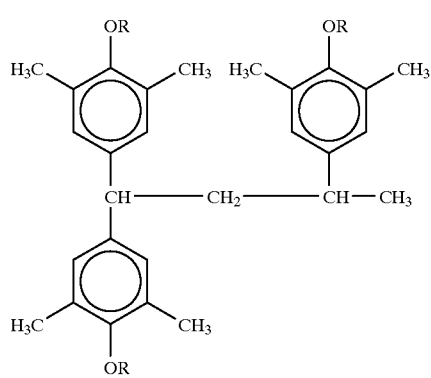
(17)
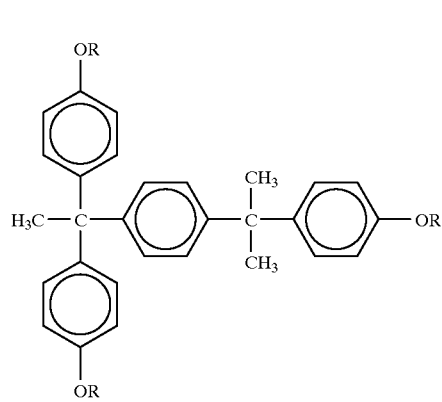
(18)
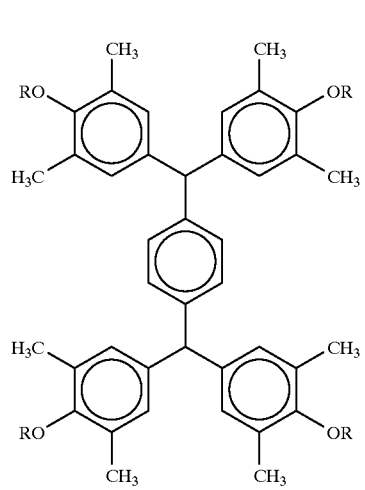
(19)

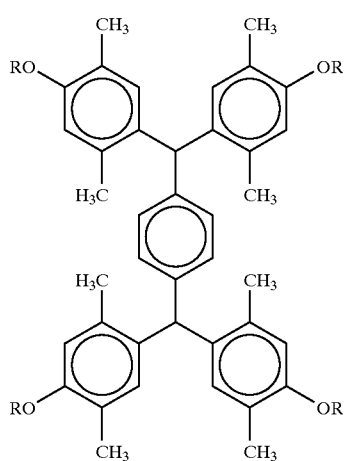
(20)
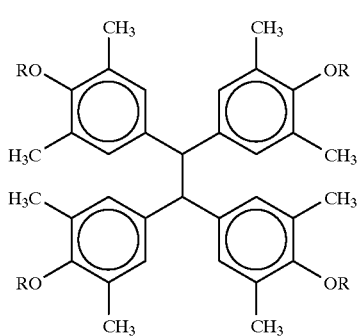
(21)
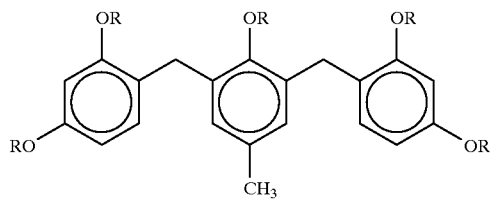
(22)
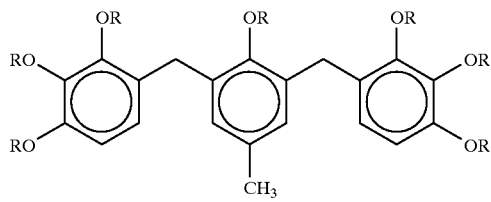
(23)
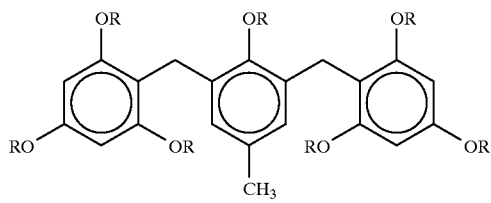
(24)

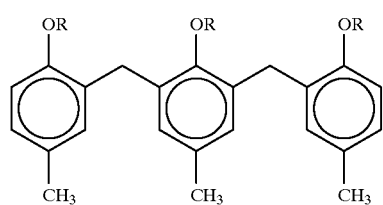
(25)
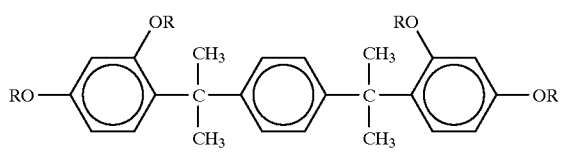
(26)
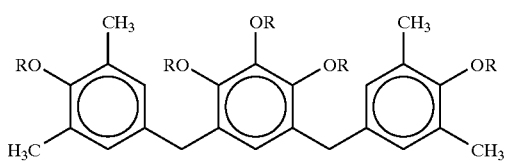
(27)
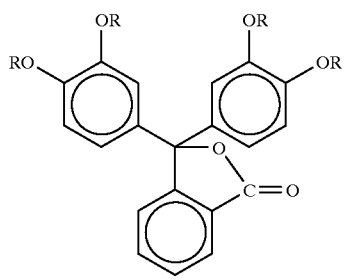
(28)
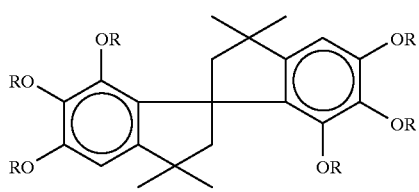
(29)
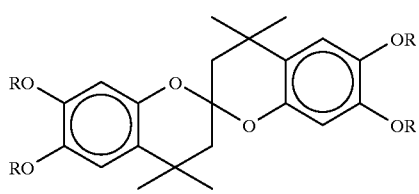
(30)

-continued
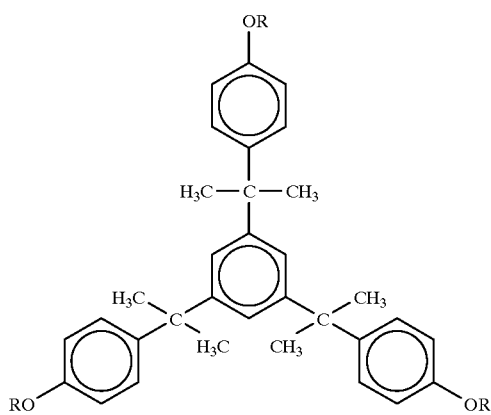
(31)
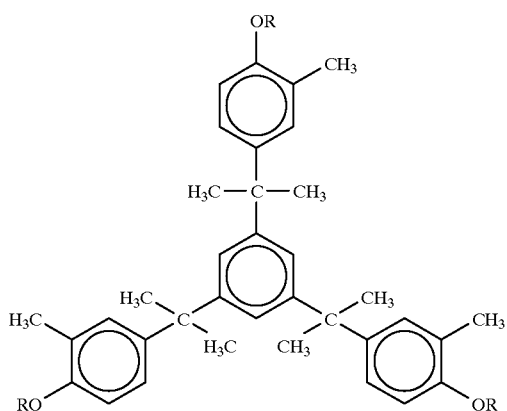
(32)
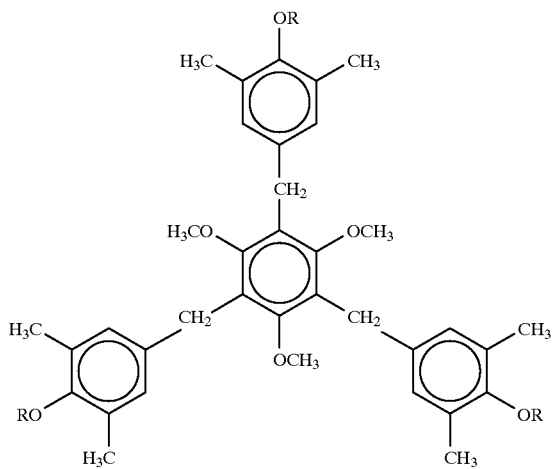
(33)

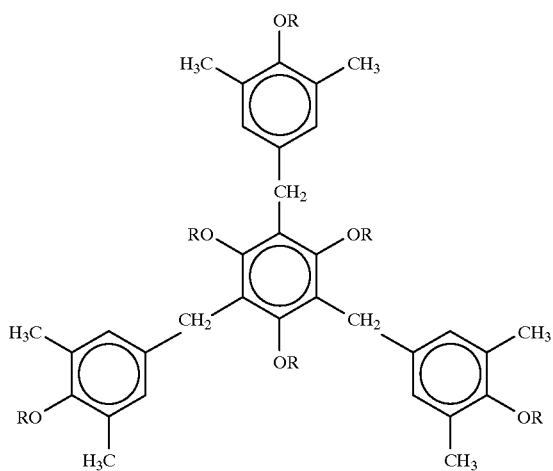
(34)
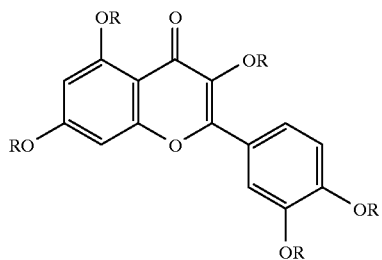
(37)
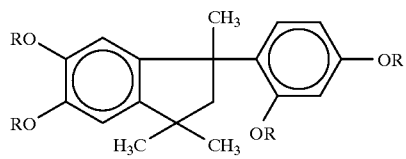
(35)
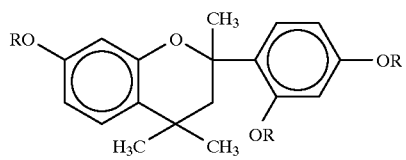
(36)
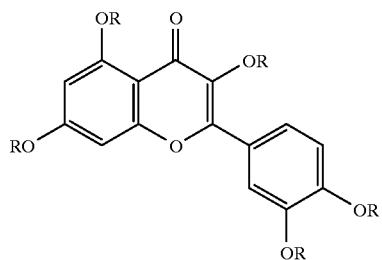
(37)

(38)
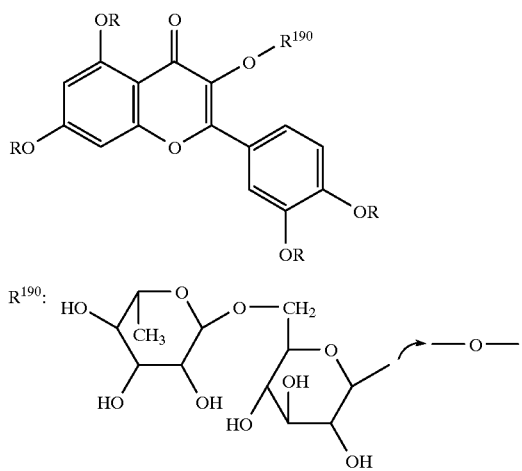
(39)
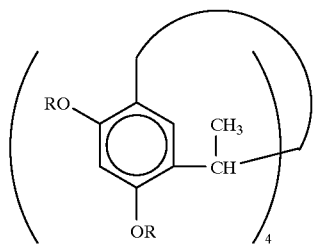
(40)
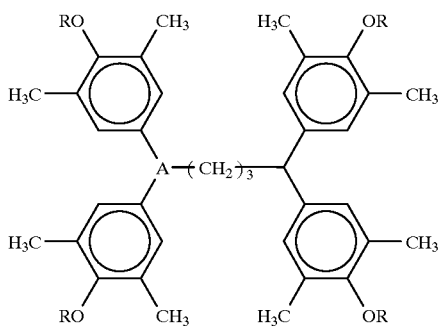
(41)
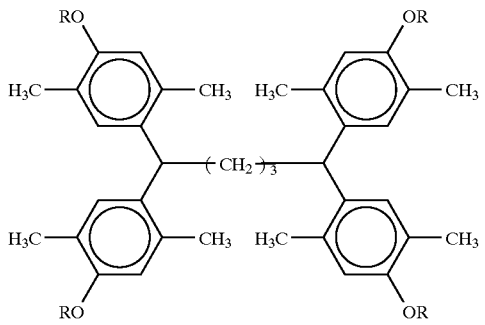

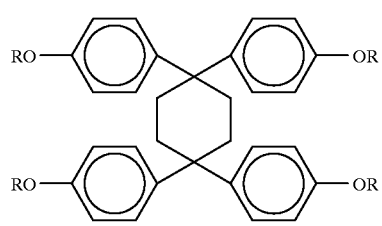
(42)
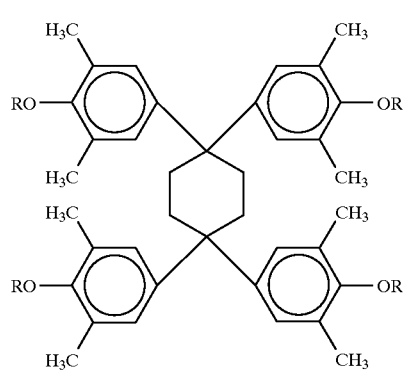
(43)
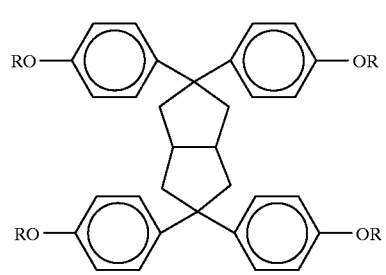
(44)
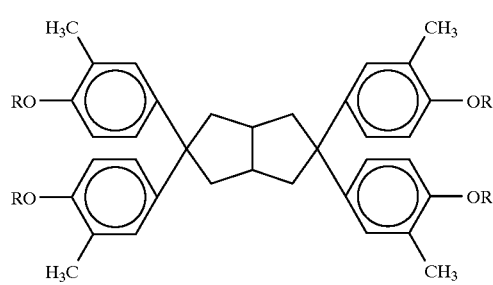
(45)
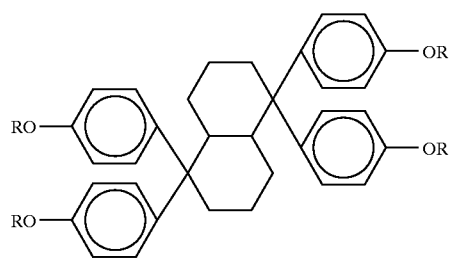
(46)

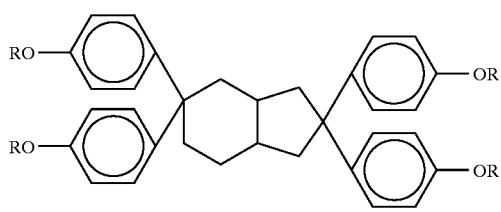
(47)
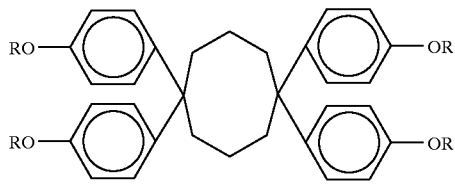
(48)
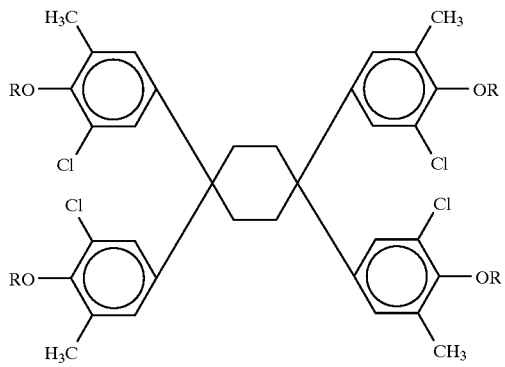
(49)
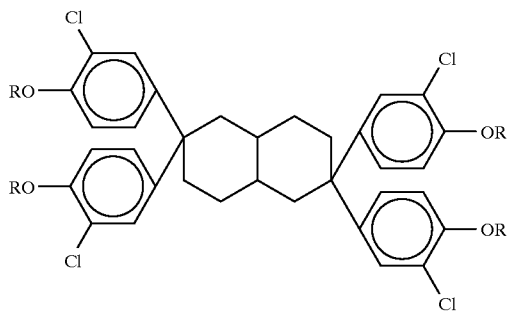
(50)
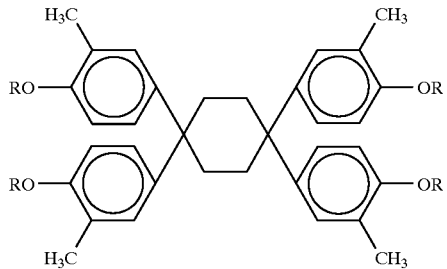
(51)

(52)
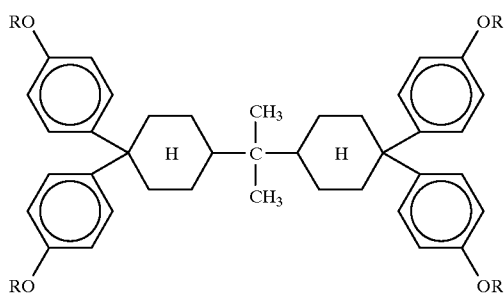
(53)
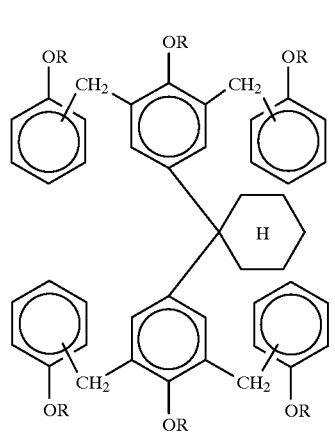
(54)
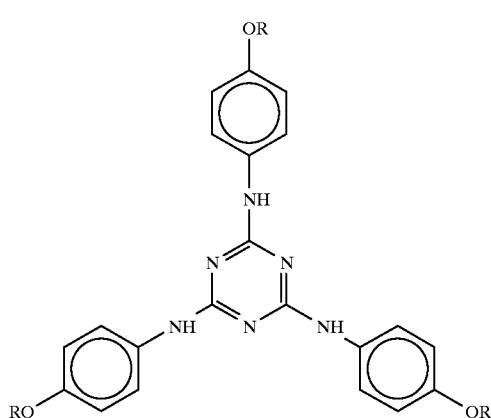
(55)
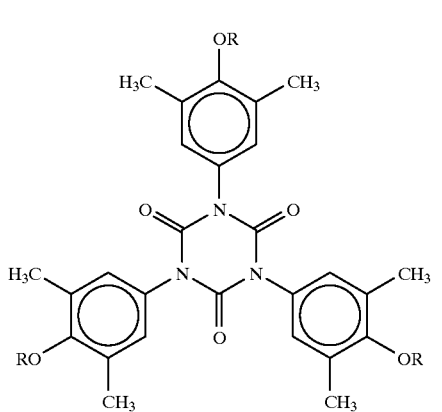

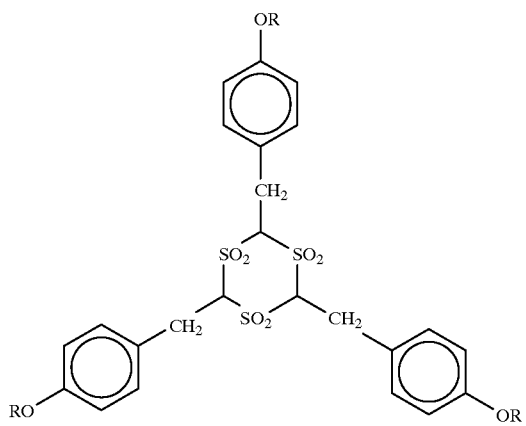
(56)
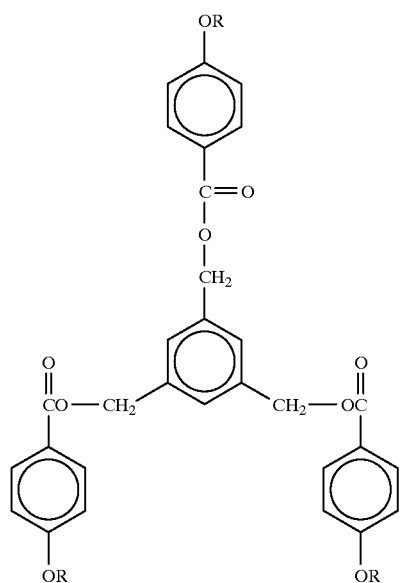
(57)
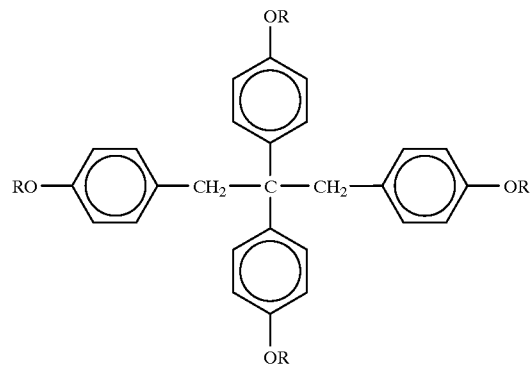
(58)

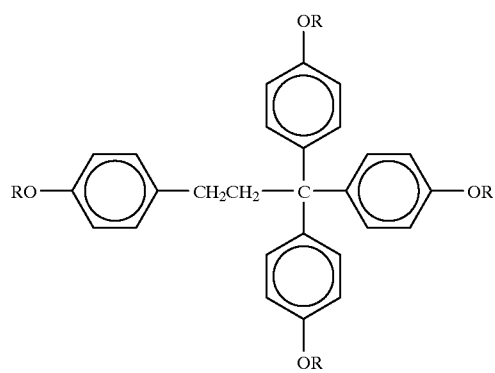
(59)
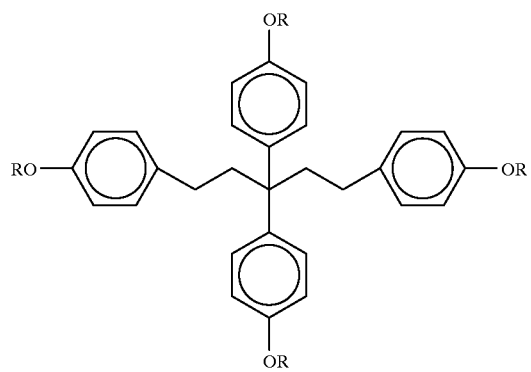
(60)
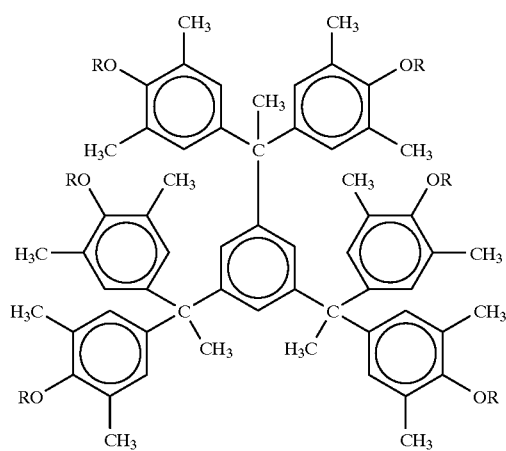
(63)
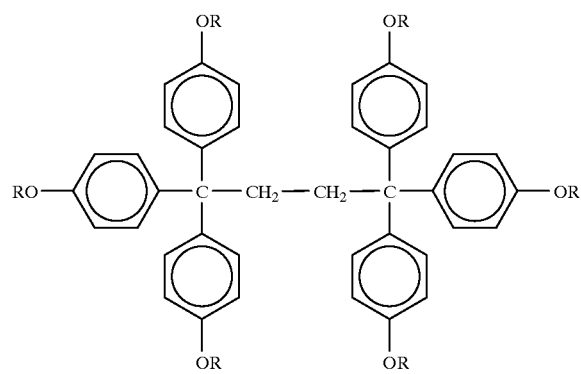
(61)

(62)

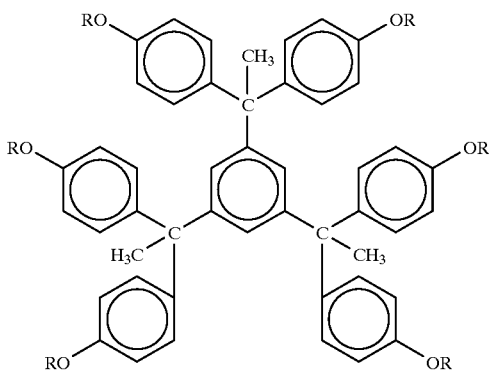

(63)

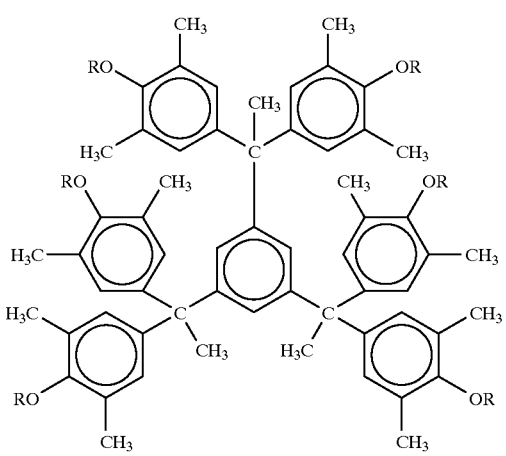

In case of Compound (A), R in compounds (1) to (63) represents a hydrogen atom or a group selected among —CH$_2$—COO—C(CH$_3$)$_2$C$_6$H$_5$, —CH$_2$—COO—C(CH$_3$)$_3$, and —COO—C(CH$_3$)$_3$, and in case of Compound (B), R represents a hydrogen atom or a group selected among the following groups:

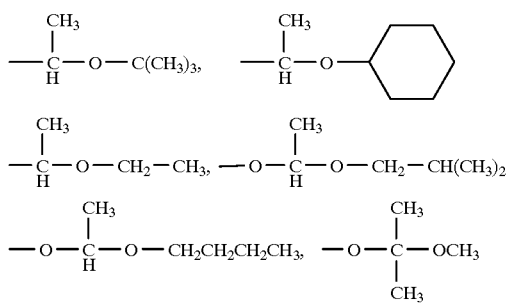

However, at least two groups or three groups (depending on the structure) represented by R are groups other than a hydrogen atom, and the substituents R are not necessarily the same group.

The total content of the non-polymer type dissolution inhibitive compound of Compounds (A) and (B) of the present invention is preferably from 3 to 30% by weight, more preferably from 3 to 28% by weight, based on the total weight of the resist composition (excluding the weight of solvent). If the content is less than 3% by weight, high resolution may not be obtained, and if it exceeds 30% by weight, film shrinkage and deterioration in thermal resistance of the resist may be caused.

Examples of the alkali-soluble resin containing no acid-decomposable groups (hereinafter simply referred to as the "alkali-soluble resin") which may be used in the present invention include alkali-soluble resins (preferably, polyhydroxystyrene, novolak resins, and their derivatives), alkali-soluble resins containing a p-hydroxystyrene unit (preferably poly(p-hydroxystyrene), p/m-hydroxystyrene copolymers, p/o-hydroxystyrene copolymers, and p-hydroxystyrene/styrene copolymers), alkyl-substituted hydroxystyrene resins (for example, 4-hydroxy-3-methylstyrene resins and 4-hydroxy-3,5-dimethylstyrene resins), and products prepared by alkylating or acetylating the hydroxyl groups of the above-mentioned resins.

Further, when phenol nuclei of the above-mentioned resins are partially hydrogenated (30 mole % or less of the total phenol nuclei contained in molecule), the resulting resin has improved transparency thereof, and is preferred in terms of sensitivity, resolution, and rectangle formation of profile.

Examples of the alkali-soluble resins used in the present invention include novolak resins, hydrogenated novolak resins, acetone-pyrogallol resins, polyhydroxystyrenes, halogen- or alkyl-substituted polyhydroxystyrenes, hydroxystyrene/N-substituted maleimide copolymers, partially O-alkylated or O-acylated products of polyhydroxystyrenes, styrene/maleic anhydride copolymers, carboxyl group-containing methacrylic resins and their derivatives, styrene/polyhydroxystyrene copolymers, and hydrogenated polyhydroxy-styrenes. However, the alkali-soluble resins used in the present invention are not limited to these examples.

The alkali-soluble resins which can be used particularly preferably in the present invention are novolak resins, alkali-soluble resins containing a p-hydroxystyrene unit (preferably, poly(p-hydroxystyrene), and p/m-hydroxystyrene, p/o-hydroxystyrene and p-hydroxystyrene/styrene copolymers), alkyl-substituted hydroxystyrene resins (for example, 4-hydroxy-3-methylstyrene resins and 4-hydroxy-3,5-dimethylstyrene resins), products prepared by alkylating or acetylating the hydroxy groups of the above-mentioned resins, partially hydrogenated polyhydroxystyrene resins, polyhydroxystyrene resins, and partially hydrogenated novolak resins.

In the present invention, the polyhydroxystyrenes mean polymers prepared by polymerization of 1 or more kinds of monomers selected among a p-hydroxystyrene monomer, a m-hydroxystyrene monomer, an o-hydroxystyrene monomer, and hydroxystyrene monomers which are substituted by an alkyl group having 1 to 4 carbon atoms at the ortho position.

The novolak resin is prepared by addition-condensation of certain monomers as main components with an aldehyde in the presence of an acidic catalyst.

Examples of the "certain monomers" include phenol, cresols such as m-cresol, p-cresol and o-cresol, xylenols such as 2,5-xylenol, 3,5-xylenol, 3,4-xylenol, and 2,3-xylenol, alkylphenols such as m-ethylphenol, p-ethylphenol, o-ethylphenol, p-tert-butylphenol, p-octylphenol, and 2,3,5-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, bisalkylphenols such as 2-methyl-4-isopropylphenol, hydroxy aromatic compounds such as m-chlorophenol, p-chlorophenol, o-chlorophenol, dihydroxybiphenyl, bisphenol A, phenylphenol, resorcinol, and naphthol. These monomers can be used singly or as a mixture of two or more kinds thereof. Monomers which can be used in the present invention are not limited to these monomers.

Examples of the aldehydes used for the preparation of the novolak resins include formaldehyde, paraformaldehyde, acetaldehyde, propionaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitro-benzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and their acetal derivatives such as chloroacetaldehyde diethylacetal. Among these, formaldehyde is preferably used. These aldehydes can be used singly or a mixture of two or more kinds thereof. Examples of the acidic catalyst include hydrochloric acid, sulfuric acid, formic acid, acetic acid, oxalic acid, and the like.

The polymer type dissolution inhibitive compound of the present invention means a resin which contains acid-decomposable groups in either or both of the main chain and the side chain of the parent resin. Among these, the resin containing the acid-decomposable groups in the side chain is more preferred.

Resins containing at least one kind of acid-decomposable groups selected among acetal groups and silyl ether groups in either or both of the main chains and the side chains of the parent resins are preferably used as the polymer type dissolution inhibitive compound of the present invention, and among these, the resins containing the acid-decomposable groups in the side chains are particularly preferred.

In a preferred embodiment of the present invention, the acid-decomposable groups in Compound (A) are represented by —COO—C($R^{01}$)($R^{02}$)($R^{03}$), and —O—CO—O—C($R^{01}$)($R^{02}$)($R^{03}$), and the acid-decomposable groups are further preferably linked to a parent compound by a structure represented by —$R^{0}$—COO—C($R^{01}$)($R^{02}$)($R^{03}$) or —Ar—O—CO—O—C($R^{01}$)($R^{02}$)($R^{03}$).

On the other hand, the acid-decomposable groups in Compound (B) are represented by —O—C($R^{04}$)($R^{05}$)—O—$R^{06}$ or —O—Si($R^{07}$)($R^{08}$)($R^{09}$), and the acid-decomposable groups are further preferably linked to a parent compound by a structure represented by —Ar—O—C($R^{04}$)($R^{05}$)—O—$R^{06}$ or —Ar—O—Si($R^{07}$)($R^{08}$)($R^{09}$).

$R^{01}$, $R^{02}$ and $R^{03}$, which may be the same or different, each represents an alkyl group, a cycloalkyl group, a alkenyl group, or an aryl group.

$R^{04}$, $R^{05}$, $R^{07}$, $R^{08}$, and $R^{09}$, which may be the same or different, each represents a hydrogen atom, an alkyl group, a cycloalkyl group, an alkenyl group, or an aryl group, with the proviso that at least 2 groups of $R^{07}$ and $R^{09}$ are groups other than a hydrogen atom and the respective 2 groups of $R^{01}$ to $R^{03}$, $R^{04}$ and $R^{05}$ and $R^{07}$ to $R^{09}$ may combine with each other to form a ring. $R^{06}$ represents an alkyl group or an aryl group. $R^{0}$ represents a divalent or more, aliphatic or aromatic hydrocarbon residue which may contain a substitute group, and —Ar— represents a divalent or more, monocyclic or polycyclic aromatic group which may contain a substituent.

The parent resins to which these acid-decomposable groups link in the side chains are preferably alkali-soluble resins containing —OH or —COOH, particularly —$R^{0}$—COOH or —Ar—OH in the side chains, and examples of preferred parent resins include the alkali-soluble resins containing no acid-decomposable groups used in the present invention (hereinafter simply referred to as the "alkali-soluble resins") (preferably polyhydroxystyrenes, novolak resins and the derivatives thereof), alkali-soluble resins containing a p-hydroxystyrene unit (preferably, poly(p-hydroxystyrene), and p/m-hydroxystyrene, p/o-hydroxystyrene and p-hydroxystyrene/styrene copolymers), alkyl-substituted hydroxystyrene resins (for example, 4-hydroxy-3-methylstyrene resins and 4-hydroxy-3,5-dimethylstyrene resins), and products prepared by alkylating or acetylating the hydroxy groups of the above-mentioned resins.

Resins in which phenol nuclei of the above-mentioned resins are partially hydrogenated (30 mole % or less of the total phenol nuclei) have improved transparency, and are preferred in terms of sensitivity, resolution and rectangle formation of profile.

Examples of the alkali-soluble resin which can be used as the parent resin include novolak resins, hydrogenated novolak resins, acetone-pyrogallol resins, polyhydroxystyrenes, halogen- or alkyl-substituted polyhydroxystyrenes, hydroxystyrene/N-substituted maleimide copolymers, partially O-alkylated or O-acylated products of polyhydroxystyrenes, styrene/maleic anhydride copolymers, carboxyl group-containing methacrylic resins and derivatives thereof, styrene/polyhydroxystyrene copolymers, and hydrogenated polyhydroxystyrenes. However, the alkali-soluble resins used as the parent resins are not limited to these examples.

The alkali-soluble resins which can be used more preferably as the parent resin are novolak resins, alkali-soluble resins containing a p-hydroxystyrene unit (preferably, poly (p-hydroxystyrene), and p/m-hydroxystyrene, p/o-hydroxystyrene, p-hydroxystyrene/styrene copolymers), alkyl-substituted hydroxystyrene resins (for example, 4-hydroxy-3-methylstyrene resins and 4-hydroxy-3,5-dimethylstyrene resins), products prepared by alkylating or acetylating the hydroxy groups of the above-mentioned resins, partially hydrogenated polyhydroxystyrene resins, polyhydroxystyrene resins, and partially hydrogenated novolak resins.

Herein, polyhydroxystyrene means a polymer prepared by polymerizing at least one kind of monomer selected among a p-hydroxystyrene monomer, a m-hydroxystyrene monomer, an o-hydroxystyrene monomer or a hydroxystyrene monomer substituted by an alkyl group having 1 to 4 carbon atoms at the ortho position to the hydroxy group.

The dissolution rate of the alkali-soluble resin used as the parent resin in alkali is preferably 170 Å/sec or more, and more preferably 330 Å/sec or more (Å=angstrom), at 23° C. in measurement with a 0.261N tetramethylammonium hydroxide (TMAH).

To attain rectangular profiles, the alkali-soluble resins preferably have high transmittance to far ultraviolet rays and excimer laser rays. In a resin of 1 μm in film thickness, the transmittance is preferably from 20 to 80% at a wavelength of 248 nm.

From this viewpoint, the alkali-soluble resin which is particularly preferably used as the parent reins are polyhydroxystyrenes, hydrogenated polyhydroxystyrenes, halogen- or alkyl-substituted polyhydroxystyrenes, partially O-acylated products of polyhydroxystyrenes, hydroxystyrene/styrene copolymers and hydrogenated novolak resins.

The resin containing the acid-decomposable group(s) of the present invention can be prepared by reacting a precursor of the acid-decomposable group with the alkali-soluble resin, or by copolymerizing various monomers with an alkali-soluble resin monomer to which the acid-decomposable group(s) link as disclosed in European Patent 254,853, JP-A-2-25850, JP-A-3-223860, and JP-A-4-251259.

The resins containing the acid-decomposable groups thus prepared are shown in the following formulas (a) to (f). However, the present invention is not limited by these resins.

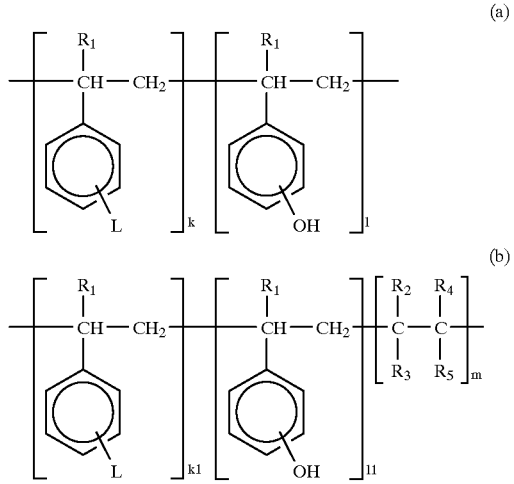

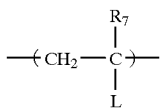

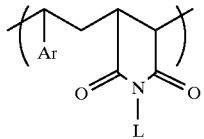

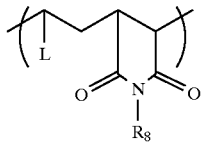

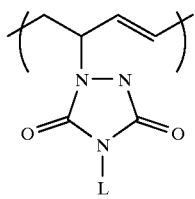

wherein L represents —$R^0$—COO—$C(R^{01})(R^{02})(R^{03})$ or —O—CO—O—$C(R^{01})(R^{02})(R^{03})$, with the proviso that $R^0$, $R^{01}$, $R^{02}$, and $R^{03}$ have the same meanings as above; plural $R_1$s, which may be the same or different, each represents a hydrogen atom or an alkyl group having 1 to 4 carbon atoms; $R_2$ and $R_4$, which may be the same or different, each represents a hydrogen atom or an alkyl group having 1 to 4 carbon atoms; $R_3$ represents a hydrogen atom, a carboxyl group, a cyano group, or a substituted aryl group; $R_5$ represents an hydrogen atom, a cyano group, or —$COOR_6$; $R_6$ represents a straight chain, branched-chain, or cyclic alkyl group having 1 to 10 carbon atoms; $R_7$ to $R_9$ each represents a hydrogen atom or an alkyl group having 1 to 4 carbon atoms; Ar represents a monovalent, monocyclic or polycyclic aromatic group which may contain substituent(s); k, l, k1, l1, and m each represents a natural number; and n represents 0 or 1.

More concretely, the following compounds (i) to (xix) can be enumerated.

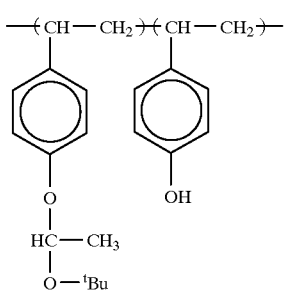

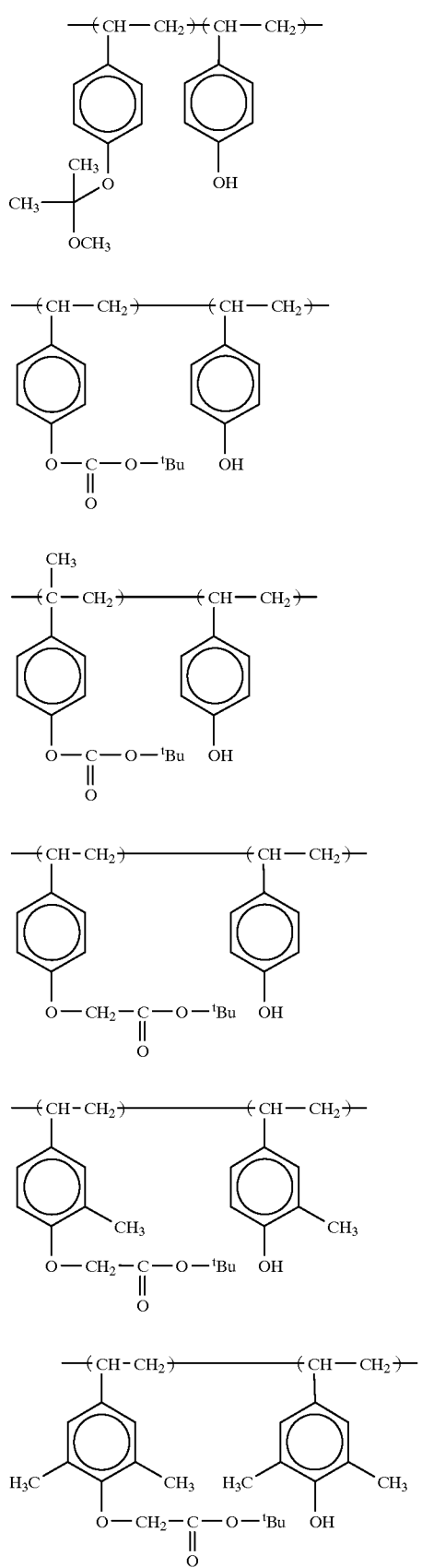
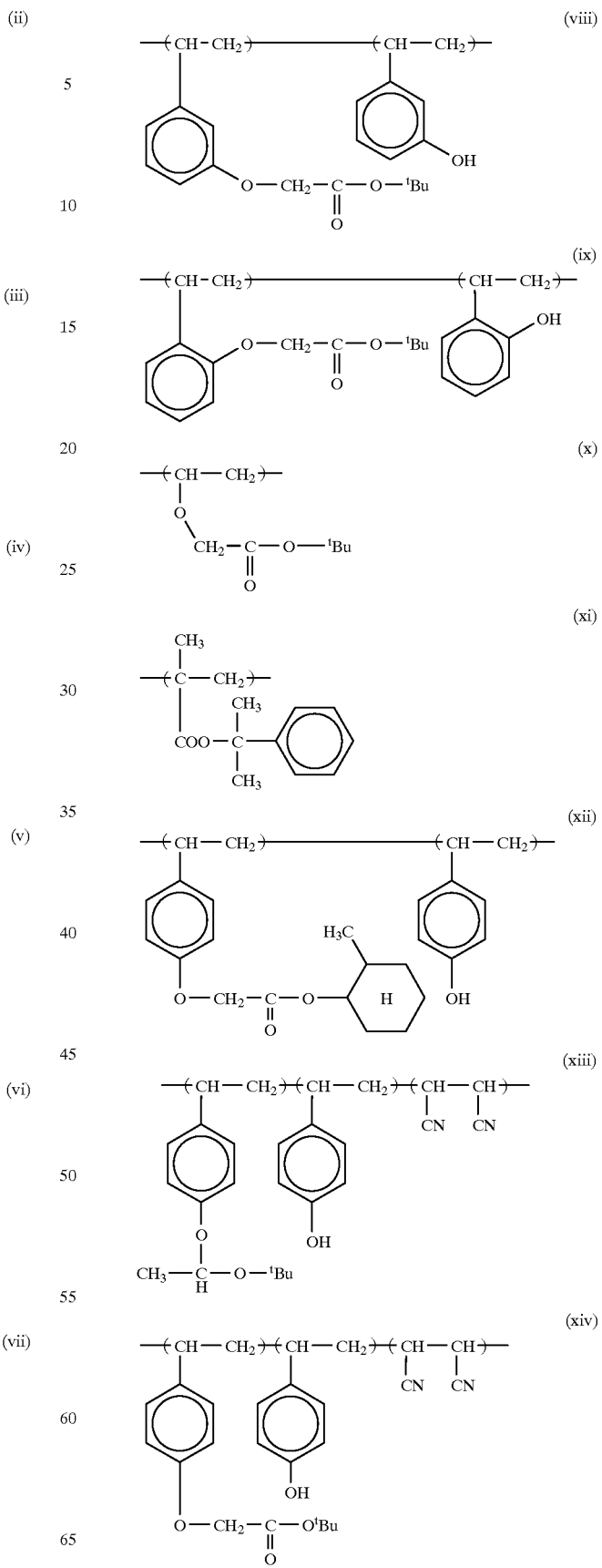

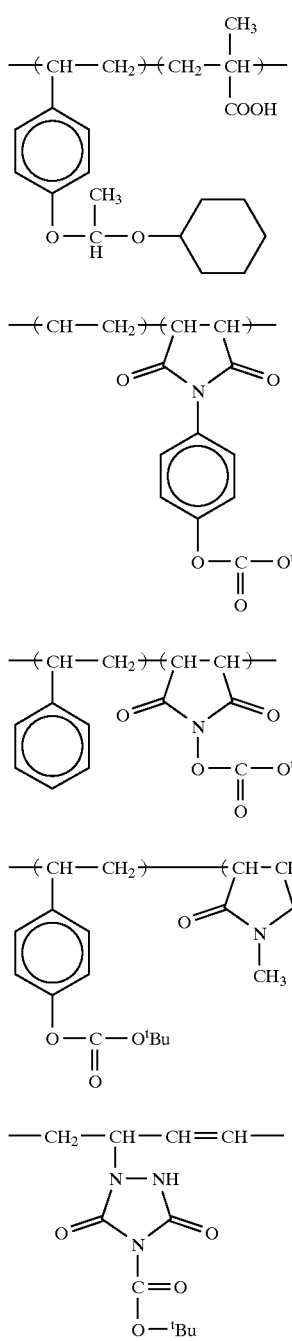

In the present invention, the content of an acid-decomposable group is given by B/(B+S), wherein B represents the number of the acid-decomposable groups in a resin and S represents the number of alkali-soluble groups which are not protected with the acid-decomposable groups. The content is generally from 0.10 to 0.40, preferably from 0.15 to 0.35, and more preferably from 0.20 to 0.35. The content exceeding 0.4 may result in film shrinkage after post exposure bake, reverse taper of a profile on defocusing, a narrow defocus latitude about isolated lines, poor adhesion to a substrate, and generation of scum, whereas the content of less than 0.10 may fail to give a sufficient process latitude.

The polymer type dissolution inhibitive compound and the alkali-soluble resin containing no acid-decomposable group each preferably has a weight average molecular weight of from 1,000 to 100,000, more preferably from 2,000 to 60,000. If the molecular weight is less than 1,000, large film decrease may be caused in unexposed areas after exposure, and if it exceeds 100,000, slow development rate may be caused. The weight average molecular weight is defined as the value reduced to polystyrene by gel permeation chromatography.

The polymer type dissolution inhibitive compounds of Compounds (A) and (B) each may be used as a mixture of two or more kinds thereof. The total content of the polymer type dissolution inhibitive compound is generally from 50 to 97% by weight, preferably from 60 to 90% by weight, based on the total weight of the resist composition (excluding the weight of a solvent). If the content thereof is less than 50% by weight, resistance to dry etching may be deteriorated.

The photo-acid generator which can be used in the present invention is a compound which generates an acid by irradiation with an active ray or radiation. Such a compound can be appropriately selected among initiators for photo-initiated cationic polymerization, initiators for photo-initial radical polymerization, photo-induced decoloring agents and photo-induced discoloring agents which are dyes, compounds which generates an acid by irradiation with known rays used for microresists or the like (ultraviolet and far ultraviolet rays having wavelengths of 200 to 400 nm, and particularly preferably, g ray, h ray, i ray, and a KrF excimer laser ray), a ArF excimer laser ray, electron radiations, X rays, molecular beams, or ion beams, and a mixture thereof.

Other examples of the compound which generates an acid by irradiation with an active ray or radiation include diazonium salts described in S. I. Schlesinger, Photogr. Sci. Eng., 18, 387 (1974), T. S. Bal et al, Polymer, 21, 423 (1980), etc.; ammonium salts described in U.S. Pat. Nos. 4,069,055 and 4,069,056, U.S. Pat. No. Re 27,992, Japanese Patent Application No. 3-140140, etc.; onium salts such as phosphonium salts described in D. C. Necker et al., Macromolecules, 17, 2468 (1984), C. S. Wen et al., Teh, Proc. Conf. Rad. Curing ASIA, p. 478, Tokyo, Oct. (1988), U.S. Pat. Nos. 4,069,055 and 4,069,056, etc., iodonium salts described in J. V. Crivello et al., Macromolecules, 10 (6) 1307 (1977), Chem. & Eng. News, Nov. 28, p. 31 (1988), European patent No. 104,143, U.S. Pat. Nos. 339,049 and 410,201, JP-A-2-150848, JP-A-2-296514, etc., sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European patent Nos. 370,693, 3,902,114, 233,567, 297, 443, and 297,442, U.S. Pat. Nos. 4,933,377, 161,811, 410, 201, 339,049, 4,760,013, 4,734,444, and 2,833,827, German patent Nos. 2,904,626, 3,604,580, and 3,604,581, etc., selenonium salts described in J. V. Crivello et al., Macromolecules, 10 (6), 1307 (1977), J. V. Crivello et al., Polymer Sci., Polymer Chem. Ed., 17, 1047 (1979), etc., arsonium salts described in C. S. Wen et al., Teh, Proc. Conf. Rad. Curing ASIA, p. 478, Tokyo, Oct. (1988), etc., organic halogenides described in U.S. Pat. No. 3,905,815, JP-B-46-4605 (the term "JP-B" as used herein means Japanese examined patent publication), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organometal/organic halogenides described in K. Meier et al., J. Rad. Curing 13 (4), 26 (1986), T. P. Gill et al., Inorg. Chem., 19, 3007 (1980), D. A. struc, Acc. Chem. Res., 19 (12), 377 (1896), JP-A-2-161445, etc.; photo-acid generators having an o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European patent Nos. 0290,750, 046,083, 156,535, 271,851, and 0,388,343, U.S. Pat. Nos. 3,901,710 and 4,181,531, JP-A-60-198538, JP-A-53-133022, etc.; compounds which are photochemically decomposed to generate sulfonic acid represented by iminosulfonate described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European patent Nos. 0199,672, 84515, 199,672, 044,115, and 0101,122, U.S. Pat. Nos. 4,618,564, 4,371,605, and 4,431,774, JP-A-64-18143, JP-A-2-245756, JP-A-4-365048, etc., and disulfone compounds described in JP-A-61-166544, etc.

Particularly, photo-acid generators containing o-nitrobenzyl type protecting groups described in the above-mentioned JP-A-53-133022 are preferably used together with the polymer type dissolution inhibitive compound of Compound (A) having the above-mentioned ratio of protection by the acid-decomposable groups, the non-polymer type dissolution inhibitive compound of Compound (B) having the above-mentioned specific content of the acid-decomposable groups, and the organic basic compound.

Furthermore, compounds in which these groups or compounds which generate an acid through light are introduced in the main chain or a side chain, for example, compounds described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9,625 (1988), Y. Yamada et al, Makromol. Chem., 152, 153, 163 (1972), J. V. Crivello et al., J. Polymer Sci., Polymer Chem. Ed., 17, 3845 (1979), U.S. Pat. No. 3,849,137, German patent No. 3,914,407, JP-A-63-26653, JP-A-55-164824, JP-A-62-69263, JP-A-63-146038, JP-A-63-163452, JP-A-62-153853, JP-A-63-146029, etc. can be used.

Moreover, compounds which generate an acid through light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, European patent No. 126,712, etc. can also be used.

Of the compounds which decomposes with irradiation of an active ray or a radiation to generate an acid, those which are particularly used effectively will be described.

Of the compounds which generate an acid with irradiation of an active ray or a radiation, those which are particularly used effectively will be described.

(1) Oxazole derivative represented by formula (PAG1) and S-triazine derivative represented by formula (PAG2), each being substituted with a trihalomethyl group.

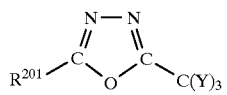

(PAG1)

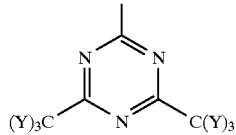

(PAG2)

wherein $R^{201}$ is a substituted or unsubstituted, aryl group or alkenyl group, $R^{202}$ is a substituted or unsubstituted, aryl group, alkenyl group or alkyl group, or —$CY^3$, where Y is a chlorine atom or a bromine atom.

Typical examples included, but are not restricted to:

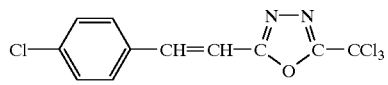

(PAG1-1)

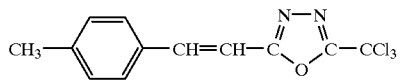

(PAG1-2)

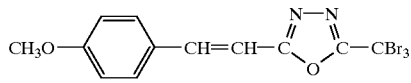

(PAG1-3)

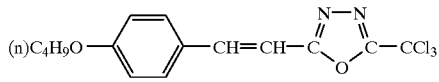

(PAG1-4)

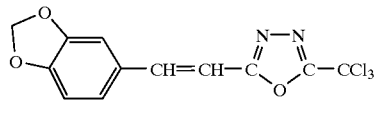

(PAG1-5)

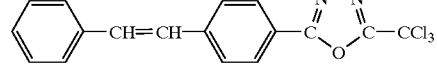

(PAG1-6)

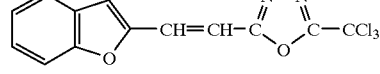

(PAG1-7)

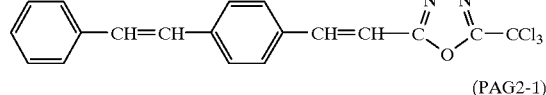

(PAG1-8)

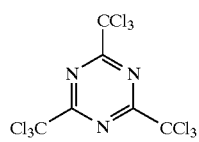

(PAG2-1)

(PAG2-2)
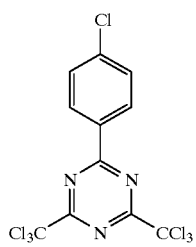

(PAG2-3)
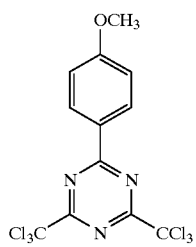

(PAG2-4)
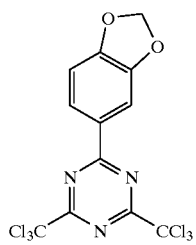

(PAG2-5)
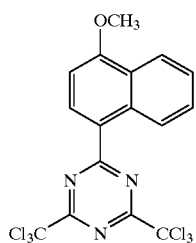

(PAG2-6)
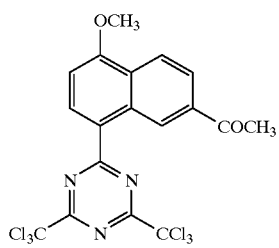

(PAG2-7)
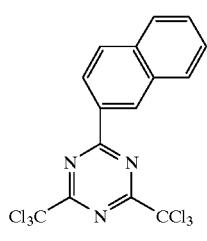

(PAG2-8)
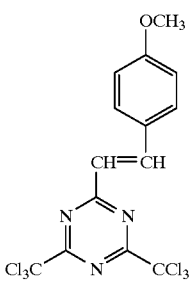

(PAG2-9)
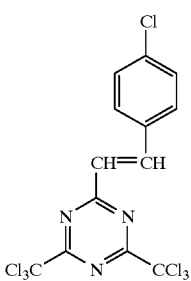

(PAG2-10)
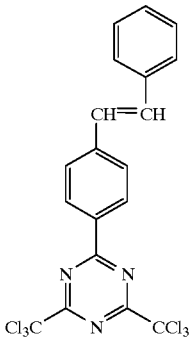

(2) Iodonium salts represented by formula (PAG3) and solufonium salt represented by formula (PAG4)

(PAG3)

(PAG4)
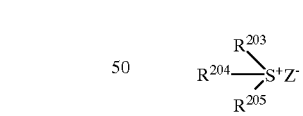

wherein $Ar^1$ and $Ar^2$ each independently are a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group, and a halogen atom.

$R^{203}$, $R^{204}$, and $R^{205}$ each independently are a substituted or unsubstituted, alkyl group or aryl group, and preferably an aryl group having 6 to 14 carbon atoms, an alkyl group having 1 to 8 carbon atoms or a substituted derivative thereof. Preferred examples of the substitutent which the aryl group can be substituted with include an alkoxy group having 1 to 8 carbon atoms, an alkyl group having 1 to 8 carbon atoms, a nitro group, a carboxyl group, a hydroxy group and a halogen atom, and preferred examples of the substitutent which the alkyl group can be substituted with include an alkoxy group having 1 to 8 carbon atoms, a carboxyl group and an alkoxycarbonyl group.

$Z^-$ represents an anion, and examples thereof include, but are not restricted to, $BF_4^-$, $AsF_6^-$, $PF_6^-$, $SbF_6^-$, $SiF_6^{2-}$, $ClO_4^-$, perfluoroalkane sulfonic anions such as $CF_3SO_3^-$, pentafluorobenzene sulfonic anion, condensed polynuclear aromatic sulfonic anions such as naphthalene-1-sulfonic anion, anthraquinone sulfonic anion, sulfonic acid group-containing dyestuffs, etc.

Two of $R^{203}$, $R^{204}$ and $R^{205}$, and $Ar^1$ and $Ar^2$ are independently a single bond or may be bonded via a substituent.

Typical examples include but are not restricted to:

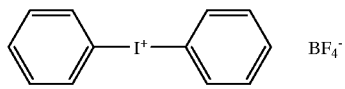
(PAG3-1)

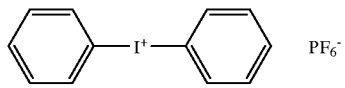
(PAG3-2)

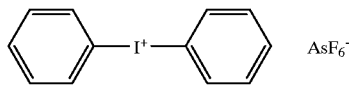
(PAG3-3)

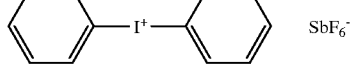
(PAG3-4)

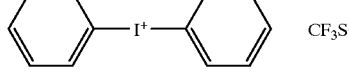
(PAG3-5)

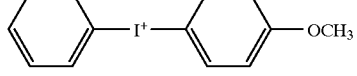
(PAG3-6)

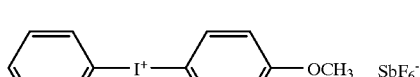
(PAG3-7)

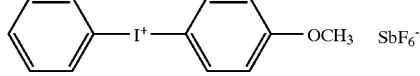
(PAG3-8)

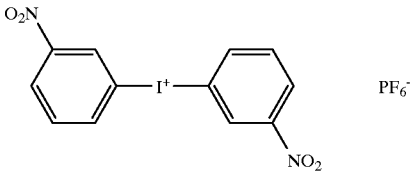

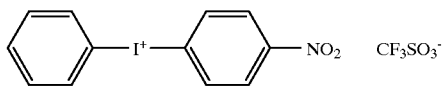
(PAG3-9)

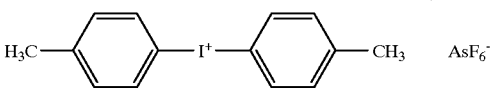
(PAG3-10)

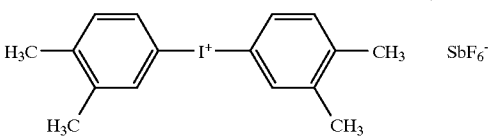
(PAG3-11)

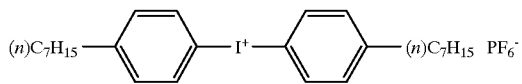
(PAG3-12)

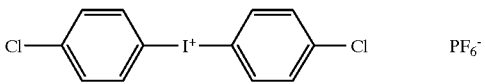
(PAG3-13)

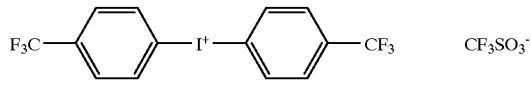
(PAG3-14)

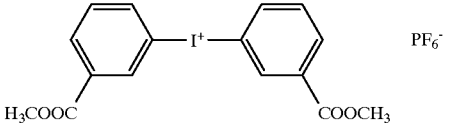
(PAG3-15)

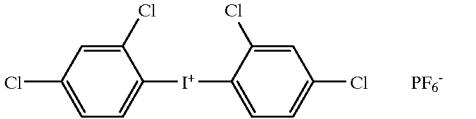
(PAG3-16)

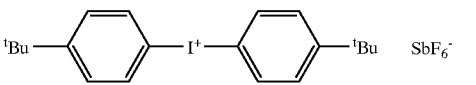
(PAG3-17)

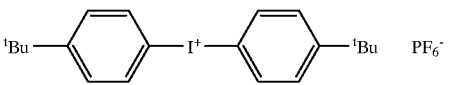
(PAG3-18)

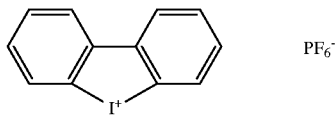
(PAG3-19)

(PAG3-20)
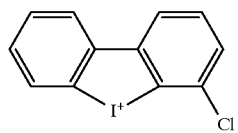 CF₃SO₃⁻
(PAG3-21)
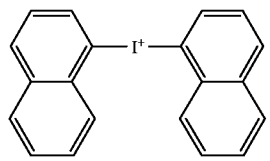 CF₃SO₃⁻
(PAG3-22)
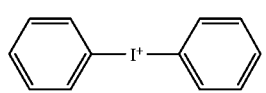 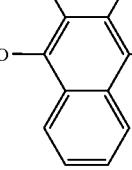
(PAG3-23)
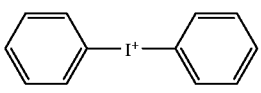 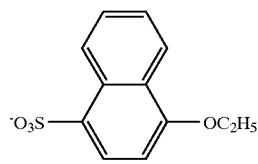
(PAG3-24)
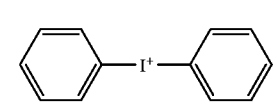 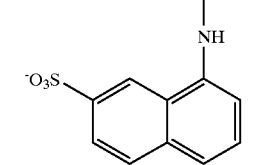
(PAG3-25)
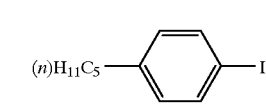
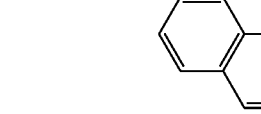
(PAG3-26)
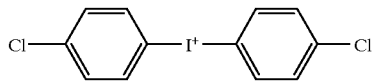
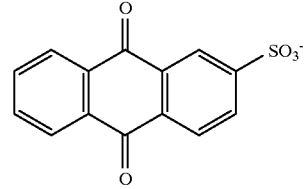
(PAG3-27)
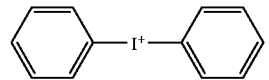
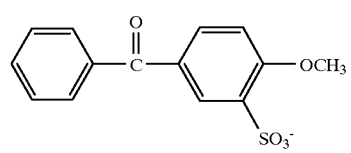
(PAG4-1)
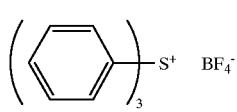 BF₄⁻
(PAG4-2)
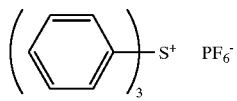 PF₆⁻
(PAG4-3)
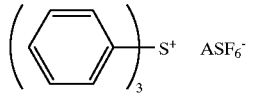 AsF₆⁻
(PAG4-4)
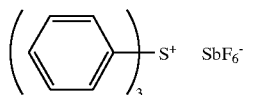 SbF₆⁻
(PAG4-5)
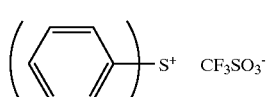 CF₃SO₃⁻
(PAG4-6)
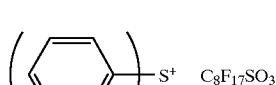 C₈F₁₇SO₃⁻
(PAG4-7)
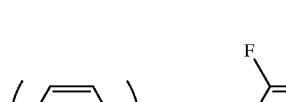 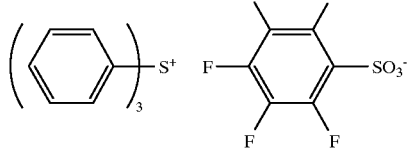
(PAG4-8)
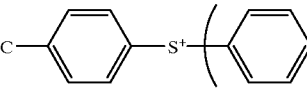 CF₃SO₃⁻

(PAG4-9)
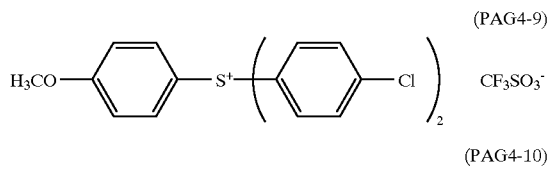
(PAG4-10)
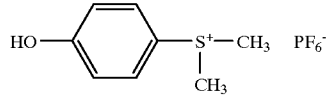
(PAG4-11)
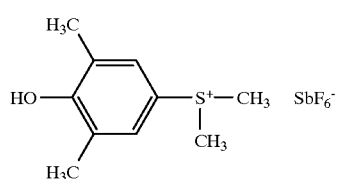
(PAG4-12)
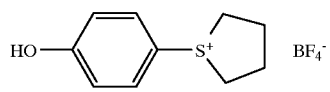
(PAG4-13)
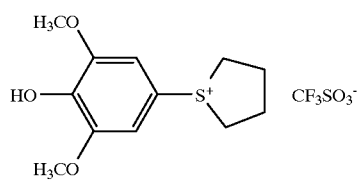
(PAG4-14)
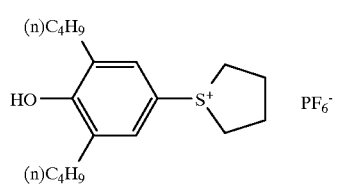
(PAG4-15)
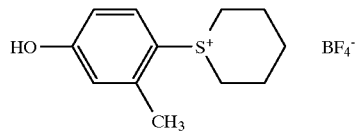
(PAG4-16)
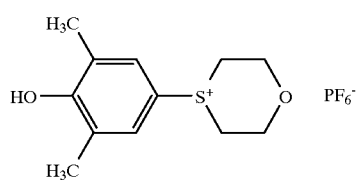
(PAG4-17)
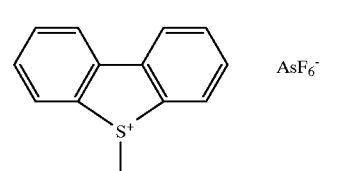
(PAG4-18)
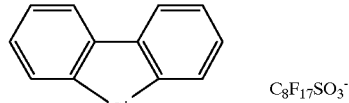
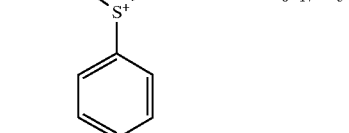
(PAG4-19)
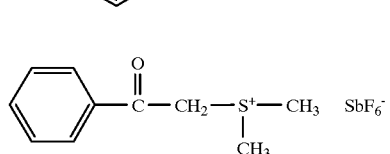
(PAG4-20)
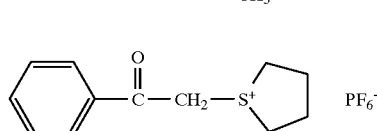
(PAG4-21)
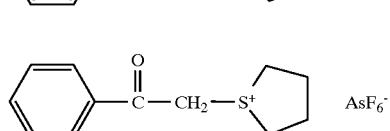
(PAG4-22)
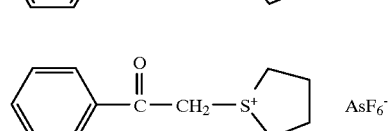
(PAG4-23)
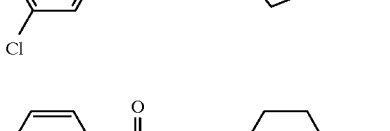
(PAG4-24)
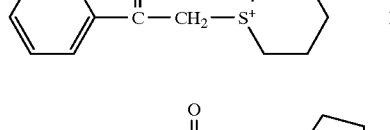
(PAG4-25)
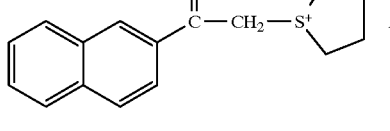
(PAG4-26)
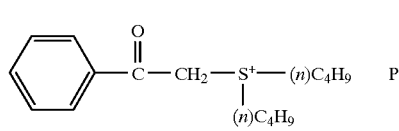
(PAG4-27)
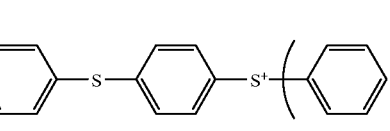
(PAG4-28)
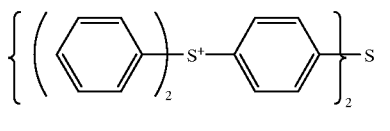

-continued (PAG4-29)

(PAG4-31)

(PAG4-30)

(PAG4-31)

The above-mentioned onium salts represented by formulae (PAG3) and (PAG4) are known and can be synthesized, for example, by a method described in J. W. Knapczyl et al., J. Am. Chem. Soc., 91, 145 (1969), A. L. Maycok et al., J. Org. Chem., 35, 2532, (1970), E. Goethas et al., Bull. Soc. Chem. Belg., 73, 546, (1964), H. M. Leicester, J. Am. Chem. Soc., 51, 3587 (1929), J. V. Crivello et al., J. Polym. Chem. Ed., 18, 2677 (1980), U.S. Pat. Nos. 2,807,648 and 4,247,473, JP-A-53-101,331, etc.

(3) Disulfonic acid derivative represented by formula (PAG5) and iminosulfonate derivative represented by formula (PAG6)

(PAG5)

$Ar^3 — SO_2 — SO_2 — Ar^4$ (PAG6)

$R^{206} — SO_2 — O — N$ wherein $Ar^3$ and $Ar^4$ are independently a substituted or unsubstituted aryl group, $R^{206}$ is a substituted or unsubstituted, alkyl group or aryl group, A is a substituted or unsubstituted, alkylene group, alkenylene group or arylene group.

Typical examples include, but are not restricted to:

(PAG5-1)

(PAG5-2)

(PAG5-3)

(PAG5-4)

(PAG5-5)

(PAG5-6)

(PAG5-7)

(PAG5-8)

(PAG5-9)

(PAG5-10)

-continued (PAG5-11)
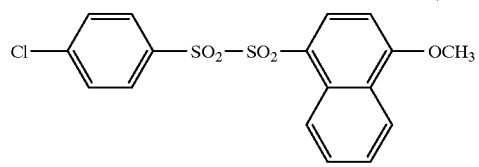

(PAG5-12)
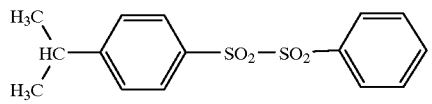

(PAG5-13)
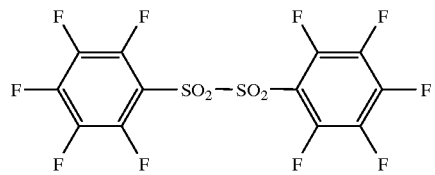

(PAG5-14)
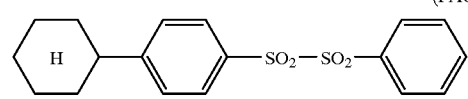

(PAG6-7)
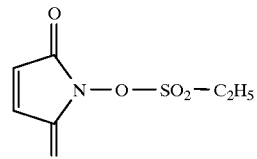

(PAG6-8)
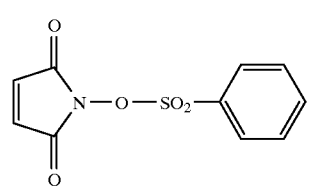

(PAG6-9)
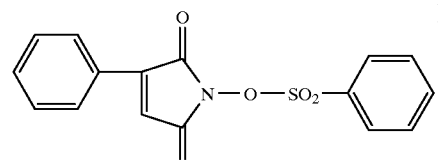

(PAG6-10)
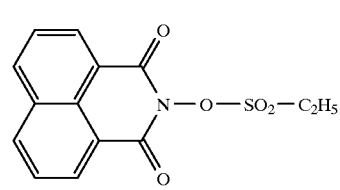

(PAG6-11)
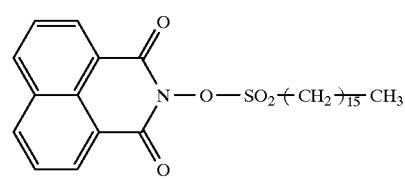

-continued (PAG6-12)
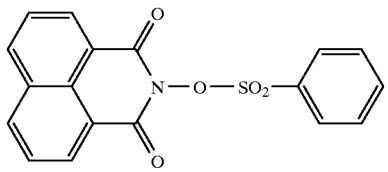

(PAG6-13)
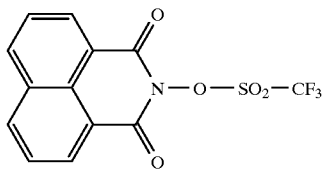

(PAG6-14)
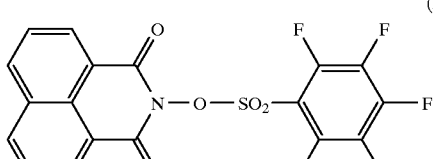

(PAG6-15)
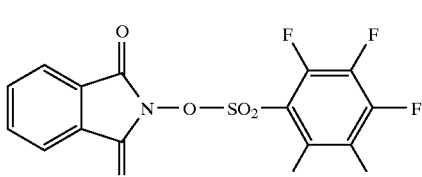

(4) o-Nitrobenzyl type photo-acid generator represented by formula (PAG7)

(PAG7)
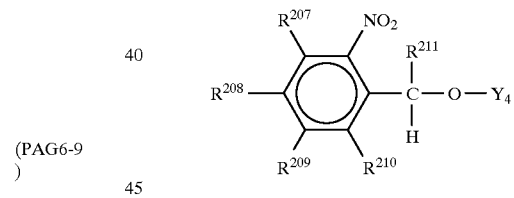

wherein $R^{207}$ to $R^{210}$, which may be the same or different, each represents a hydrogen atom, an alkyl group having 1 to 6 carbon atoms, an aryl group having 5 to 14 carbon atoms, an aralkyl group having 6 to 20 carbon atoms, a cycloalkyl group having 3 to 6 carbon atoms, a perfluoroalkyl group having 1 to 6 carbon atoms, a perfluoroaryl group having 5 to 14 carbon atoms, a nitro group, or a cyano group; $R^{211}$ represents a hydrogen atom, an alkyl group having 1 to 6 carbon atoms, and an aryl group having 5 to 14 carbon atoms; $Y_4$ represents —$SO_2R^{212}$; $R^{212}$ represents an alkyl group having 1 to 6 carbon atoms, an aryl group having 5 to 14 carbon atoms, an aryl group having 5 to 14 carbon atoms which has an alkoxy group having 1 to 6 carbon atoms, an aralkyl group having 6 to 20 carbon atoms, a cycloalkyl group having 3 to 6 carbon atoms, a perfluoroalkyl group having 1 to 6 carbon atoms, or an aryl group having 5 to 14 carbon atoms which has a perfluoroalkyl group having 1 to 6 carbon atoms or a fluorine atom in place of hydrogen atom(s).

Examples of the photo-acid generators represented by general formula (PAG7) are as follows:

(PAG7-1)
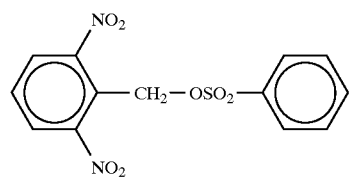
(PAG7-2)
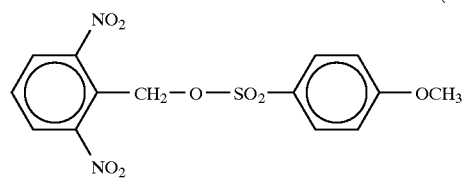
(PAG7-3)
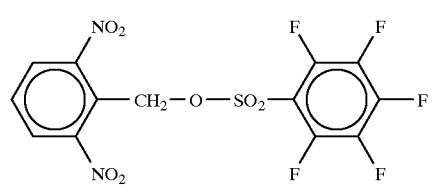
(PAG7-4)
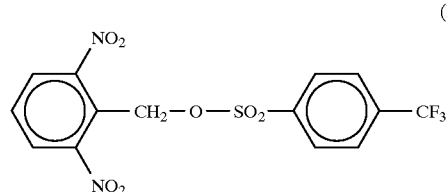
(PAG7-5)
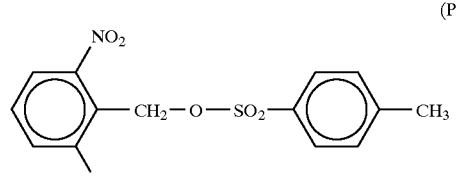
(PAG7-6)
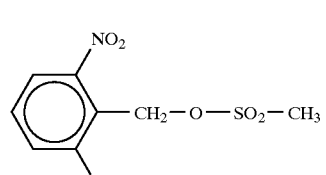
(PAG7-7)
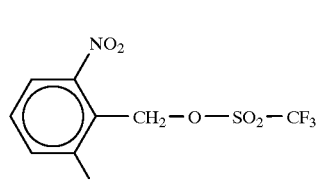
(PAG7-8)
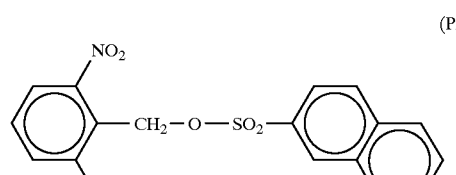
-continued
(PAG7-9)
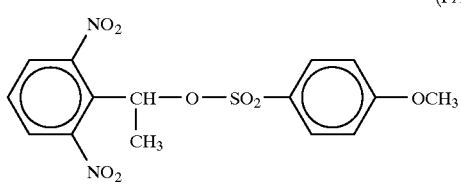
(PAG7-10)
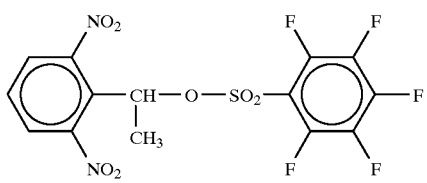
(PAG7-11)
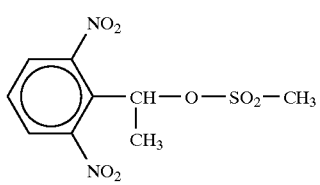
(PAG7-12)
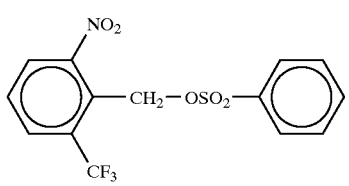
(PAG7-13)
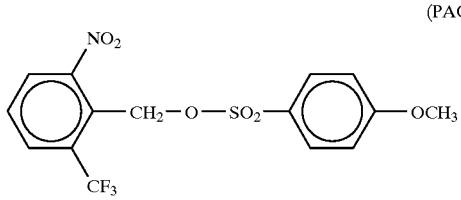
(PAG7-14)
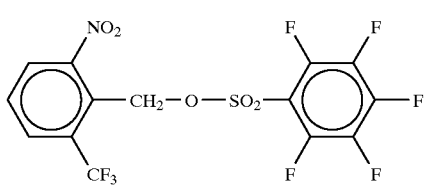
(PAG7-15)
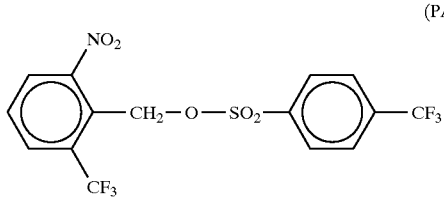

(PAG7-16) 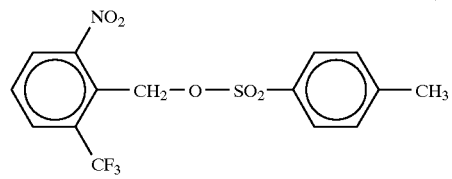
(PAG7-17) 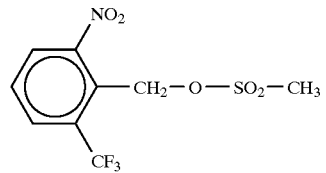
(PAG7-18) 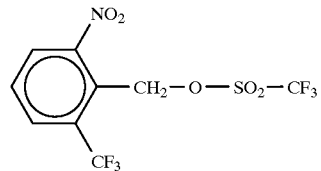
(PAG7-19) 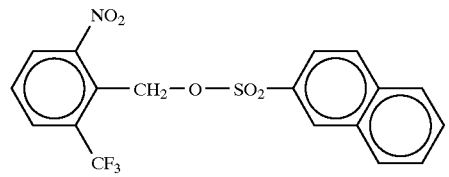
(PAG7-20) 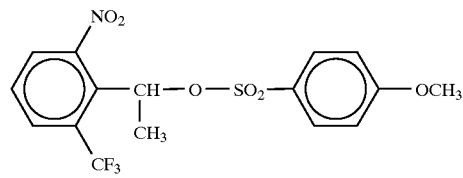
(PAG7-21) 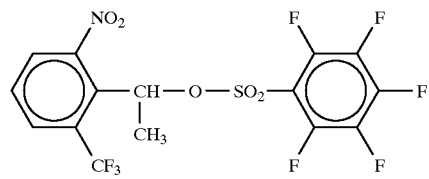
(PAG7-22) 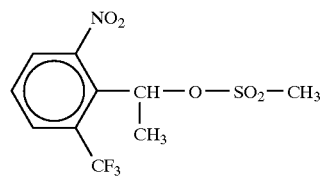
(PAG7-23) 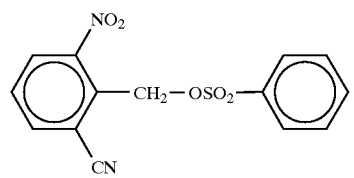
(PAG7-24) 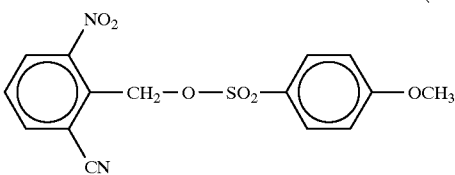
(PAG7-25) 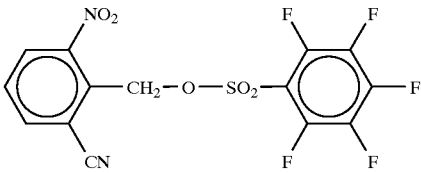
(PAG7-26) 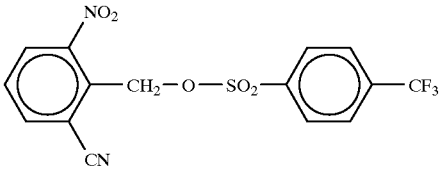
(PAG7-27) 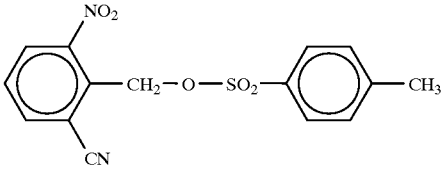
(PAG7-28) 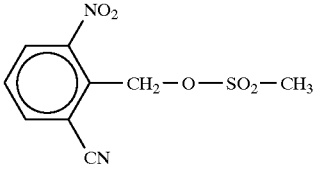
(PAG7-29) 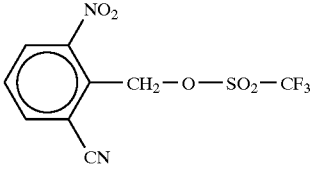
(PAG7-30) 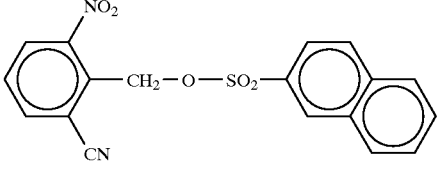
(PAG7-31) 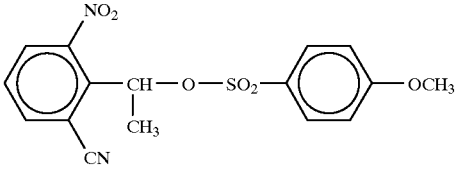

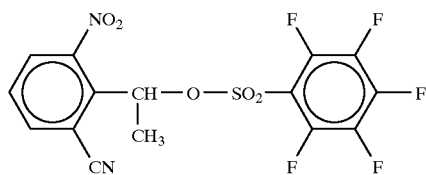

(PAG7-32)

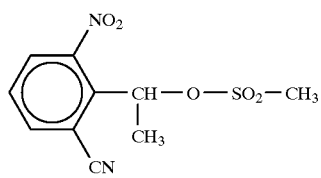

(PAG7-33)

It is preferred in the present invention that the compound which generates an acid by the irradiation with an active ray or radiation is selected from onium salts, disulfones, 4-DNQ-sulfonates, triazine compounds, and o-nitrobenzyl type photo-acid generators.

The content of the compound which decomposes by the irradiation with these active rays or radiations to generate acids usually ranges from 0.001 to 40% by weight, preferably from 0.01 to 20% by weight, and more preferably from 0.1 to 5% by weight, based on the total weight of the photosensitive composition (excluding the weight of a coating solvent). The content of less than 0.001% by weight may result in low sensitivity, whereas the content exceeding 40% by weight may cause deterioration in profile and narrowed margin of processes (particularly, bake), because of too high absorption of light by the resists.

Preferred examples of the organic basic compound which can be used in the present invention include compounds having stronger basicity than phenol. Above all, nitrogen-containing basic compounds are preferred. The following structures (A) to (E) have preferred chemical environments.

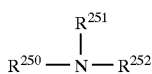

(A)

(B)

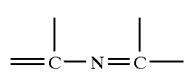

(C)

(D)

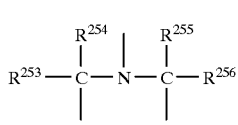

(E)

wherein $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms; $R^{253}$, $R^{254}$, $R^{255}$, and $R^{256}$, which may be the same or different, each represents an alkyl group having 1 to 6 carbon atoms, with the proviso that $R^{254}$ and $R^{255}$ may combine with each other to form a ring.

More preferred examples of the organic basic compound include compounds containing two or more nitrogen atoms which are in different chemical environments in one molecule, and particularly preferred examples thereof include those having both of a substituted or unsubstituted amino group and a nitrogen-containing cyclic group, or those having an alkylamino group. Preferred examples thereof include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted imidazoles, substituted or unsubstituted pyrazolines, substituted or unsubstituted piperadines, substituted or unsubstituted aminomorpholines, and substituted or unsubstituted aminoalkylmorpholines. Preferred substituents for these compounds are an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group. Examples of the organic basic compound used particularly preferably in the present invention include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethyl-pyridine, 4-aminoethylpyridine, 3-aminopyrrolidine, piperazine, N-(2-aminoethyl) piperazine, N-(2-aminoethyl)-piperidine, 4-amino-2,2,6,6-tetramethylpiperidine, 4-piperidinopiperidine, 2-iminopiperidine, 1-(2-aminoethyl)-pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, imidazole, 2,4,5-triphenylimidazole, 2-pyrazoline, 3-pyrazoline, N-aminomorpholine, N-(2-aminoethyl)morpholine. However, the organic basic compounds used in the present invention are not limited to these compounds.

These nitrogen-containing basic compound can be used singly or as a mixture of two or more kinds thereof. The content of the nitrogen-containing basic compound is usually from 0.001 to 10 parts by weight, and preferably from 0.01 to 5 parts by weight, based on 100 parts by weight of the photosensitive resin composition (excluding the weight of a solvent). The content of less than 0.001 parts by weight may fail to offer the effect of the present invention, whereas the content exceeding 10 parts by weight may cause sensitivity decrease and deterioration in developability in unexposed areas.

Surfactants, dyes, pigments, plasticizers, photosensitizers, and compounds containing 2 phenolic hydroxyl groups which promote dissolution in a developer can be added to the chemically amplified positive resist composition of the present invention.

Examples of the suitable surfactant include, as nonionic surfactants, polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenol ether and polyoxyethylene nonyl phenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; as fluorine type surfactants, FFTOP EF301, EF303 and EF352 (manufactured by Shin-Akita Gosei Co., Ltd.); Megafac F171 and F173 (manufactured by Dainippon Ink and Chemicals, Inc.); Florad FC430 and EC431 (Sumitomo 3M Co., Ltd.); and Asahiguard AG710 and Surflon S-382, SC101, SC102, SC103, SC104, SC105 and SC106 (manufactured by Asahi Glass Co., Ltd.); an organosiloxane polymer KP341 (manufactured by Shin-Etsu Chemical Co., Ltd.); acrylic acid type or methacrylic acid type (co)polymers, Polyflow No.75 and No.95 (manufactured by Kyoei-Sha Oil and Fats Co., Ltd.).

The surfactant can be added to the resist composition singly or as a mixture of some kinds thereof. The content of the surfactant is preferably from 0.0005 to 0.01 parts by weight, based on 100 parts by weight of the composition (excluding the weight of solvent).

Examples of the suitable dye include oil dyes and basic dyes. Examples thereof include Oil Yellow #101, Oil Yellow #103, Oil Pink #312, Oil Green BG, Oil Blue BOS, Oil Blue #603, Oil Black BY, Oil Black BS, and Oil Black T-505 (The dyes described above are manufactured by Orient Chemical Industry Co., Ltd), Crystal Violet (CI42555), Methyl Violet (CI42535), Rhodamine B (CI45170B), Malachite Green (CI42000), and Methylene Blue (CI52015).

The addition of the spectral sensitizer as exemplified below to the resist composition makes it possible to sensitize the chemically amplified positive resist in the region of wavelengths longer than far ultraviolet rays to give the sensitivity towards i ray or g ray to the chemically amplified resist of the present invention. Examples of the spectral sensitizer used preferably include benzophenone, p,p'-tetramethyldiaminobenzophenone, p,p'-tetraethylethylaminobenzophenone, 2-chlorothioxantone, anthrone, 9-ethoxyanthracene, anthracene, pyrene, perylene, phenothiazine, benzil, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethyl-anthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin), and coronene. The spectral sensitizers used in the present invention are not limited to these compounds.

Examples of the compound containing two or more phenolic hydroxyl groups which promotes dissolution in a developer include polyhydroxy compounds. Preferred examples of the polyhydroxy compound includes phenols, resorcin, phloroglucin, phloroglucide, 2,3,4-trihydroxybenzophenone, 2,3,4,4'-tetrahydroxybenzophenone, α,α',α"-tris(4-hydroxyphenyl)-1,3,5-triisopropylbenzene, tris(4-hydroxyphenyl)methane, tris(4-hydroxyphenyl)ethane, and 1,1'-bis(4-hydroxyphenyl)-cyclohexane.

The chemically amplified positive resist composition of the present invention is dissolved in a solvent capable of dissolving each of the above-mentioned kinds of the components, and applied to a substrate. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, and tetrahydrofuran. The solvent is used singly or as a mixture thereof.

The chemically amplified positive resist composition of the present invention is applied to a substrate (for example, silicon coated with silicon dioxide) as used for manufacturing precise integrated circuit devices by an appropriate coating method using a spinner, a coater, or the like, exposed to light through a certain mask, and then subjected to bake and development to obtain a satisfactory resist pattern.

Examples of the developer for the chemically amplified positive resist composition of the present invention include aqueous solutions of the following alkalis; inorganic alkalis such as sodium hydroxide, potassium hydroxide, sodium carbonate, sodium silicate, sodium phosphate, sodium metasilicate, and aqueous ammonia; primary amines such as ethylamine and n-propylamine; secondary amines such as diethylamine and di-n-butylamine; tertiary amines such as triethylamine and methyldiethylamine; alcoholamines such as dimetylethanolamine and triethanolamine; amides such as formamide and acetamide; quaternary ammonium salts such as tetramethylammonium hydroxide, trimethyl(2-hydroxyethyl)ammonium hydroxide, tetraethylammonium hydroxide, tributylmethylammonium hydroxide, tetraethanolammonium hydroxide, methyltriethanol-ammonium hydroxide, benzylmethyldiethanolammonium hydroxide, benzyldimethylethanolammonium hydroxide, benzyltriethanol-ammonium hydroxide, tetrapropylammonium hydroxide, and tetrabutylammonium hydroxide; and cyclic amines such as pyrrole and piperidine.

Thus, the present invention can provide a chemically amplified positive resist composition capable of forming a good resist which does not have the disadvantages of sensitivity decrease, T-top formation and narrowed line width which are caused with a lapse of time from exposure to post exposure bake.

The present invention is illustrated below with reference to the following examples. However, the present invention is not limited by these examples.

EXAMPLES

Synthesis Example-1

To carry out a polymerization reaction, 27.5 g (0.17 mole) of p-acetoxystyrene and 3.15 g (0.030 mole) of styrene were dissolved in 120 ml of butyl acetate, and 0.033 g of azobisisobutyronitrile (AIBN) was then added to the resulting solution 3 times at intervals of 2 hours at 80° C. with stirring in a stream of nitrogen. Finally, stirring was further continued for 2 hours. The reaction mixture was poured into 600 ml of hexane to precipitate a white resin.

After being dried, the resin thus prepared was dissolved in 150 ml of methanol, and a aqueous solution of 7.7 g (0.19 mole) of sodium hydroxide in 50 ml of water was added to the solution, and refluxed for 3 hours to hydrolyze the resin. Thereafter, the resulting solution was diluted with 200 ml of water, and neutralized with hydrochloric acid to precipitate a white resin.

The resin thus precipitated were filtered off, washed with water, and dried to obtain 21 g of a resin. It was confirmed by a NMR measurement that the composition of the resin had a proportion of p-hydroxystyrene: styrene=about 85:15 and it was confirmed by GPC measurement that the weight average molecular weight was 27,000. The resin was alkali-soluble resin (I-2) used in the examples and comparative examples described below.

Synthesis Example 2

48.1 g of poly(p-hydroxystyrene) (the weight average molecular weight 11,000, the degree of dispersion 1.10) and 0.19 g of p-toluenesulfonic acid monohydrate was dissolved in 250 ml of dehydrated 1,4-dioxane and the resulting solution was cooled to 15° C. A solution of 16.0 g of tert-butyl vinyl ether in 30 ml of 1,4-dioxane was added dropwise to this solution with stirring in a stream of nitrogen over a 20-minute period, and stirring was further continued at 15° C. for 1 hour. The reaction mixture was neutralized with triethylamine, and then poured into a solution of 3 g of triethylamine in 3 liter of ion exchanged water with stirring. A resin thus precipitated was filtered off, washed with water, and dried in vacuo at 40° C. to obtain 59 g of a white resin. It was confirmed by NMR measurement that 36% of the hydroxyl groups of the starting poly(p-hydroxystyrene) was t-butoxy-1-ethylated (tert-butylacetal formation). The resin was polymer type dissolution inhibitive compound (II-1) used in the examples and comparatie examples described below.

Synthesis Example 3

12 g of poly(p-hydroxystyrene) (Mw 9,600) was dissolved in 120 ml of N,N-dimethylacetamide, and 3 g of potassium carbonate and 4.5 g of tert-butyl bromoacetate were successively added thereto. The resulting mixture was stirred at 120° C. for 7 hours, and then cooled and poured into methanol to precipitate a crystal. The crystal was filtered off, washed with methanol, and dried in vacuo to obtain polymer type dissolution inhibitive compound (II-2), which was used in the examples and comparatie examples described below.

Synthesis Example 4

Polymer type dissolution inhibitive compound (II-3) was prepared in the same manner as in Synthesis Example 2, except that 64 g of Lyncur PHM-C (Mw 5,200, manufactured by Maruzen Petrochemical Co., Ltd.) was used in place of poly(p-hydroxystyrene). This compound was used in the examples and comparatie examples described below.

Synthesis Example 5

In a 300-ml three-necked flask, 44 g of 1,3,3,5-tetrakis-(4-hydroxyphenyl)pentane and 50 g of t-butyl vinyl ether were placed, and subsequently, 50 ml of dehydrated dioxane and 50 ml of dehydrated methylene chloride were added and the mixture was stirred. Further, 2 g of pyridinium p-toluenesulfonate was added, and the resulting mixture was stirred at room temperature for 2 hours, and then at 50° C. for 24 hours. The reaction mixture was extracted with methylene chloride, the methylene chloride layer was washed with water 3 times and dried, and the solvent was distilled away by use of an evaporator. A viscous oil thus prepared was purified by column chromatography on silica gel (developing solvent: ethyl acetate/n-hexane=¼ by volume) to obtain 54.5 g of compound 1 as a colorless viscous substance (yield 65%). NMR measurement proved that this substance was non-polymer type dissolution inhibitive compound (III-1) used in the examples and comparatie examples described below.

Synthesis Example 6

To a solution of 8.48 g (0.020 mole) of α,α',α"-tris(4-hydroxyphenyl)-1,3,5-triisopropylbenzene in 120 ml of N,N-dimethylacetamide, 4.2 g (0.03 mole) of potassium carbonate and 12.3 g of (0.063 mole) of tert-butyl bromoacetate were successively added, and stirred at 120° C. for 7 hours. The reaction mixture was poured into 1.5 liters of water, and extracted with ethyl acetate. The ethyl acetate layer was dried over magnesium sulfate, concentrated, and purified by column chromatography [carrier: silica gel, developing solvent: ethyl acetate/n-hexane=⅖ (by volume)] to obtain 13 g of a desired product. NMR measurement proved that this product was non-polymer type dissolution inhibitive compound (III-2) used in the examples and comparatie examples described below.

Synthesis Example 7

Non-polymer type dissolution inhibitive compound (III-3) was prepared in the same manner as in Synthesis Example 6 except that 6.6 g of 1,3,3,5-tetrakis(4-hydroxyphenyl) pentane was used in place of α,α',α"-tris(4-hydroxyphenyl)-1,3,5-triisopropylbenzene.

Compounds used for examples and comparative examples are as follows:

(I-1)

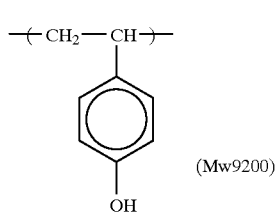

(Mw9200)

-continued
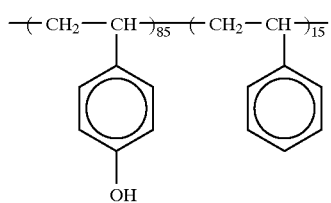
(I-2)
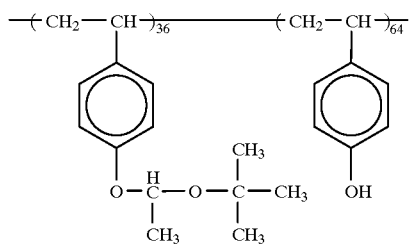
(II-1)
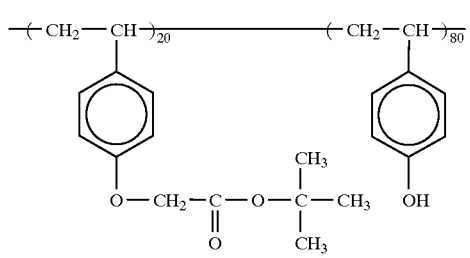
(II-2)
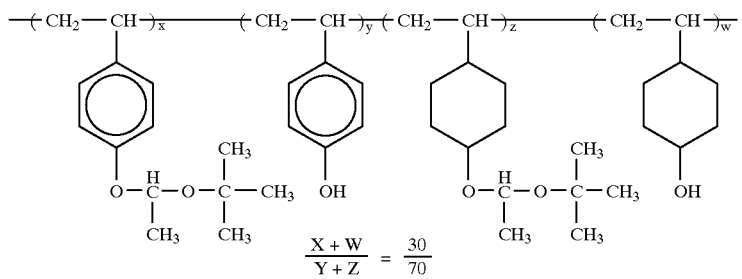
$$\frac{X+W}{Y+Z} = \frac{30}{70}$$
(II-3)
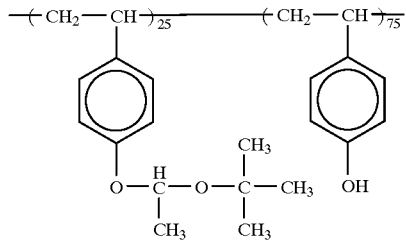
(II-4)

-continued
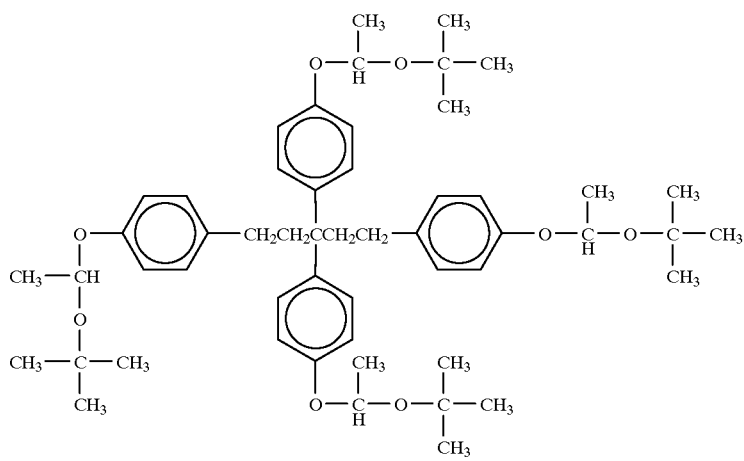
(III-1)
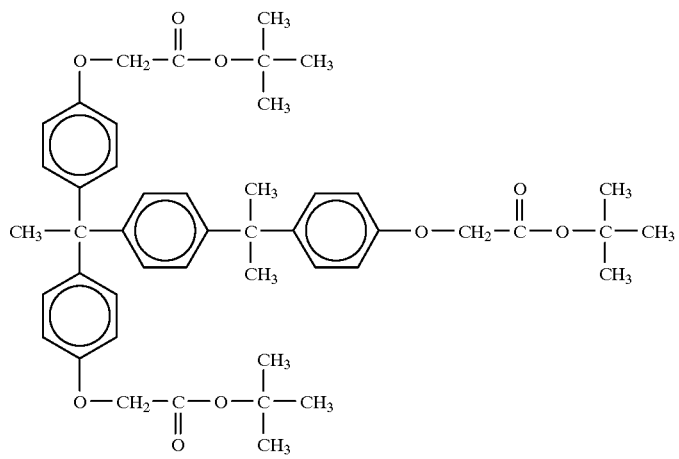
(III-2)
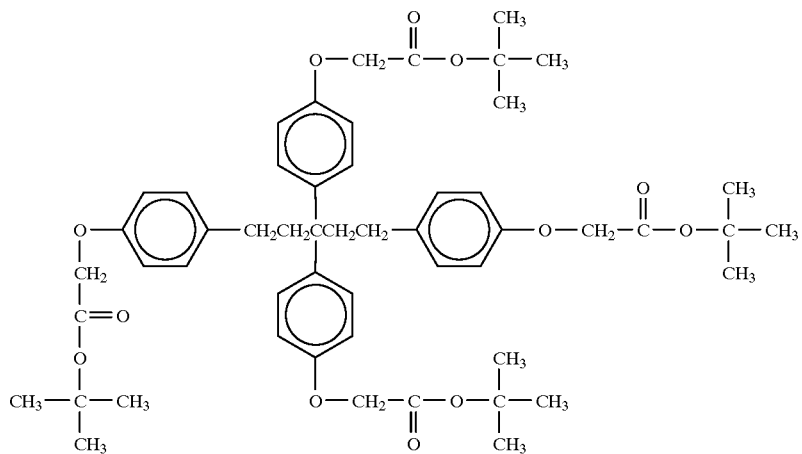
(III-3)
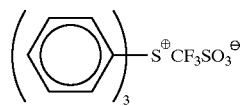
(IV-1)

-continued

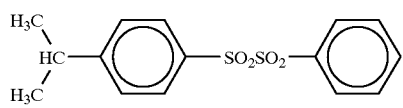
(IV-2)

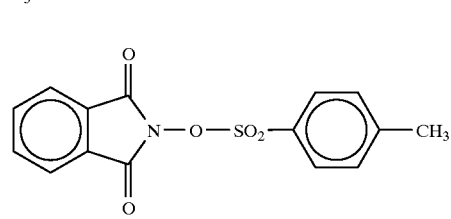
(IV-3)

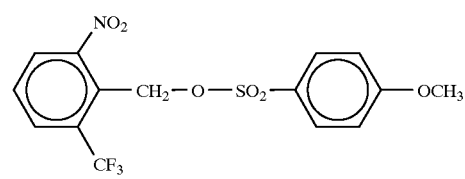
(IV-4)

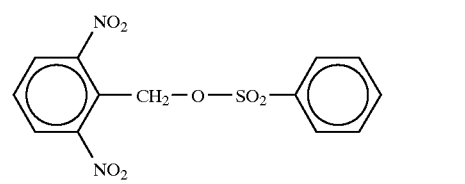
(IV-5)

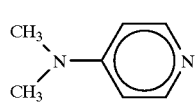
(V-1)

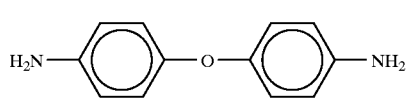
(V-2)

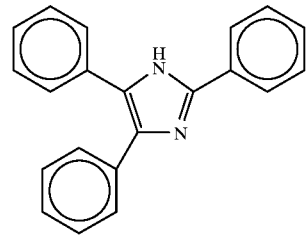
(V-3)

Examples 1 to 11 and Comparative Examples 1 to 4 Preparation and Evaluation of Photosensitive Compositions The respective materials shown in Table 1 were dissolved in 8 g of propylene glycol monoethyl ether acetate (PGMEA), filtered out through a filter having a pore size of 0.2 μm, to prepare a resist solution. The resist solution was applied to a silicon wafer by use of a spin coater, and dried on a vacuum adsorption type hot plate at 120° C. for 60 seconds to obtain a resist film having a thickness of 0.8 μm.

Each of the thus-obtained resist films was exposed to light by use of a 248-nm KrF excimer laser stepper (NA=0.45). Immediately after the exposed resist was heated on a hot plate at 100° C. for 60 seconds, the resist was dipped in an 0.26N aqueous solution of tetramethylammonium hydroxide (TMAH) for 60 seconds, rinsed with water for 30 seconds, and then dried. Pattern thus obtained on the silicon wafer was observed using a scanning electron microscope to evaluate resist performance. The results are shown in Table 2.

Resolving power is represented by threshold resolving power in an exposure amount required to reproduce a mask pattern of 0.40 μm.

The rate of the sensitivity decrease due to PED (time elapsing from exposure to post exposure bake) is shown by the sensitivity after an elapse of 90 minutes as PED (an exposure amount required to reproduce a 0.40 μL/S mask pattern) divided by the sensitivity after an elapse of 5 minutes or less in PED (an exposure amount required to reproduce a 0.40 μL/S mask pattern).

To evaluate the T-top formation due to PED, a profile after an elapse of 90 minutes as PED was compared with a profile after an elapse of 5 minutes or less as PED. Samples in which the T-top formation was not observed were indicated by "A"; samples in which the T-top formation was not substantially recognized as important were indicated by "B"; samples in which the T-top formation was observed were indicated by "C"; and samples in which too large T-top was formed so that a line sticks to the next line were indicated by "D".

In evaluation of change in line width due to PED, when a bottom size of 0.40 $\mu$L/S mask pattern after an elapse of 90 minutes as PED in the same exposure amount as the sensitivity after an elapse of 5 minutes or less as PED (an exposure amount required to reproduce a 0.40 $\mu$L/S mask pattern) is in the range of 0.40±0.04 $\mu$L/S, the sample is indicated by "A"; when the bottom size is in the range of 0.40±0.08 $\mu$L/S, it is indicated by "B", and when the bottom size is out of the range of 0.40±0.08 $\mu$L/S, it is indicated by "C".

TABLE 1

| | Alkali-Soluble Binder (g) | Polymer Type Dissolution Inhibitive Compound | | Non-polymer Type Dissolution Inhibitive Compound | | Photo-Acid Generator (g) | Organic Basic Compound (g) |
|---|---|---|---|---|---|---|---|
| | | Compound (g) | Kind of Acid-Decomposable Group | Compound (g) | Kind of Acid-Decomposable Group | | |
| Example No. | | | | | | | |
| 1 | | II-1 (0.960) | B | | | IV-2 (0.060) | V-3 (0.004) |
| | | II-2 (0.960) | A | | | | |
| 2 | | II-3 (1.440) | B | III-2 (0.500) | A | IV-1 (0.060) | V-1 (0.004) |
| 3 | | II-2 (1.500) | A | III-1 (0.400) | B | IV-1 (0.060) | V-2 (0.003) |
| 4 | | II-1 (1.450) | B | III-1 (0.250) | B | IV-1 (0.060) | V-1 (0.003) |
| | | | | III-2 (0.250) | A | | |
| 5 | I-2 (1.440) | | | III-1 (0.120) | B | IV-1 (0.060) | V-2 (0.004) |
| | | | | III-3 (0.400) | A | | |
| 6 | I-1 (1.000) | II-3 (0.500) | B | III-3 (0.500) | A | IV-1 (0.060) | V-3 (0.003) |
| 7 | I-1 (0.374) | II-1 (1.200) | B | III-2 (0.300) | A | IV-3 (0.12) | V-2 (0.006) |
| 8 | I-2 (0.542) | II-3 (1.000) | B | III-3 (0.350) | A | IV-4 (0.06) IV-1 (0.04) | V-3 (0.008) |
| 9 | | II-4 (1.672) | B | III-3 (0.100) | A | IV-3 (0.12) | V-3 (0.008) |
| | | | | III-2 (0.100) | | | |
| 10 | | II-4 (1.692) | B | III-3 (0.200) | A | IV-4 (0.10) | V-3 (0.008) |
| 11 | | II-4 (1.692) | B | III-3 (0.200) | A | IV-5 (0.05) IV-1 (0.05) | V-2 (0.006) |
| Comparative Example No. | | | | | | | |
| 1 | I-2 (1.440) | | | III-2 (0.500) | A | IV-1 (0.060) | |
| 2 | | II-2 (1.440) | A | III-3 (0.500) | A | IV-1 (0.060) | V-2 (0.004) |
| 3 | | II-1 (1.440) | B | III-1 (0.500) | B | IV-1 (0.060) | |
| 4 | | II-3 (1.440) | A | | | IV-1 (0.060) | V-1 (0.003) |

TABLE 2

| Example No. | Threshold Resolving Power | Rate of Sensitivity Decrease due to PED | T-top formation due to PED | Change in Line Width due to PED |
|---|---|---|---|---|
| 1 | 0.28 | 1.0 | B | B |
| 2 | 0.26 | 1.0 | A | B |
| 3 | 0.28 | 1.1 | B | B |
| 4 | 0.26 | 1.0 | A | B |
| 5 | 0.28 | 1.1 | B | B |
| 6 | 0.26 | 1.0 | A | B |
| 7 | 0.26 | 1.0 | A | A |
| 8 | 0.25 | 1.1 | A | B |
| 9 | 0.26 | 1.0 | A | A |
| 10 | 0.26 | 1.0 | A | A |
| 11 | 0.25 | 1.1 | B | B |
| Comparative Example No. | | | | |
| 1 | 0.30 | impossible to calculate | D | C |
| 2 | 0.32 | 1.5 | C | C |
| 3 | 0.34 | 1.1 | A | C |
| 4 | 0.32 | 1.0 | A | C |

The result of Table 2 shows that the resists of the present invention have high resolving power and form satisfactory resist patterns without undergoing the sensitivity decrease, T-top formation, and change in line width which are caused from exposure to post exposure bake.

While the invention has been described in detail with reference to specific embodiments, it will be apparent to one skilled in the art that various changes and modifications can be made to the invention without departing from its spirit and scope.

What is claimed is:

1. A chemically amplified positive resist composition which comprises:

(A) a non-polymer dissolution inhibitive compound which contains at least one group selected among tert-alkyl ester groups and tert-alkyl carbonate groups wherein said dissolution inhibitive compound has a molecular weight of 3,000 or less and contains three or more acid-decomposable groups in one molecule; (Compound (A)), (B) a polymer dissolution inhibitive compound having a p-hydroxystyrene structure of which part or all of phenolic hydroxyl groups are protected by at least one group selected among acetal groups and silyl ether groups and is capable of increasing solubility of the compound in an alkali aqueous solution by the action of an acid (Compound (B)), (C) a compound which is capable of generating an acid by irradiation with an active ray or radiation (Compound (C)), and (D) an organic basic compound.

2. The chemically amplified positive resist composition of claim 1, wherein said Compounds (A) and (B) each is at least one of a polymer dissolution inhibitive compound and a non-polymer dissolution inhibitive compound.

3. The chemically amplified positive resist composition of claim 1, which further comprises an alkali-soluble resin, wherein at least one of said Compounds (A) and (B) is a non-polymer dissolution inhibitive compound.

* * * * *